US008466756B2

(12) United States Patent
Milosavljevic et al.

(10) Patent No.: US 8,466,756 B2
(45) Date of Patent: Jun. 18, 2013

(54) METHODS AND APPARATUS FOR MATCHING AN ANTENNA

(75) Inventors: Zlatoljub Milosavljevic, Kempele (FI); Kimmo Koskiniemi, Oulu (FI); Petteri Annamaa, Oulunsalo (FI); Prasadh Ramachandran, Oulu (FI)

(73) Assignee: Pulse Finland Oy, Kempele (FI)

( * ) Notice: Subject to any disclaimer, the term of this patent is extended or adjusted under 35 U.S.C. 154(b) by 655 days.

(21) Appl. No.: 12/596,141

(22) PCT Filed: Apr. 17, 2008

(86) PCT No.: PCT/FI2008/050200
§ 371 (c)(1),
(2), (4) Date: May 17, 2010

(87) PCT Pub. No.: WO2008/129125
PCT Pub. Date: Oct. 30, 2008

(65) Prior Publication Data
US 2010/0244978 A1 Sep. 30, 2010

(30) Foreign Application Priority Data
Apr. 19, 2007 (FI) .................................. 20075269

(51) Int. Cl.
*H03H 7/38* (2006.01)
(52) U.S. Cl.
USPC ......................................................... 333/17.3
(58) Field of Classification Search
USPC ............................ 333/17.3, 32, 33
See application file for complete search history.

(56) References Cited

U.S. PATENT DOCUMENTS

| 2,745,102 A | 5/1956 | Norgorden |
| 3,938,161 A | 2/1976 | Sanford |
| 4,004,228 A | 1/1977 | Mullett |

(Continued)

FOREIGN PATENT DOCUMENTS

| CN | 1316797 | 10/2007 |
| DE | 10015583 | 11/2000 |

(Continued)

OTHER PUBLICATIONS

"An Adaptive Microstrip Patch Antenna for Use in Portable Transceivers", Rostbakken et al., Vehicular Technology Conference, 1996, Mobile Technology for the Human Race, pp. 339-343.

(Continued)

*Primary Examiner* — Stephen Jones
(74) *Attorney, Agent, or Firm* — Gazdzinski & Associates, PC

(57) ABSTRACT

A method and an arrangement for matching the antenna of a radio device in transmitting condition. The antenna impedance in the output of the power amplifier of a transmitter is adjusted by means of a π-shaped reactive matching circuit, the component values of which can be selected from a relatively wide array of the alternatives. The component values are selected using multiple-way switches, which only are located in the transverse branches of the matching circuit. The switches are set by the control unit, input variables of which being the SWR value provided by the directional coupler, the operating band used each time and a value of the transmitting power. The matching is based on an adjusting process to be executed at regular intervals, in which process the control unit tries different combinations of the switch states and finally selects the combination, which brings the lowest SWR value.

20 Claims, 6 Drawing Sheets

U.S. PATENT DOCUMENTS

Figure 1:
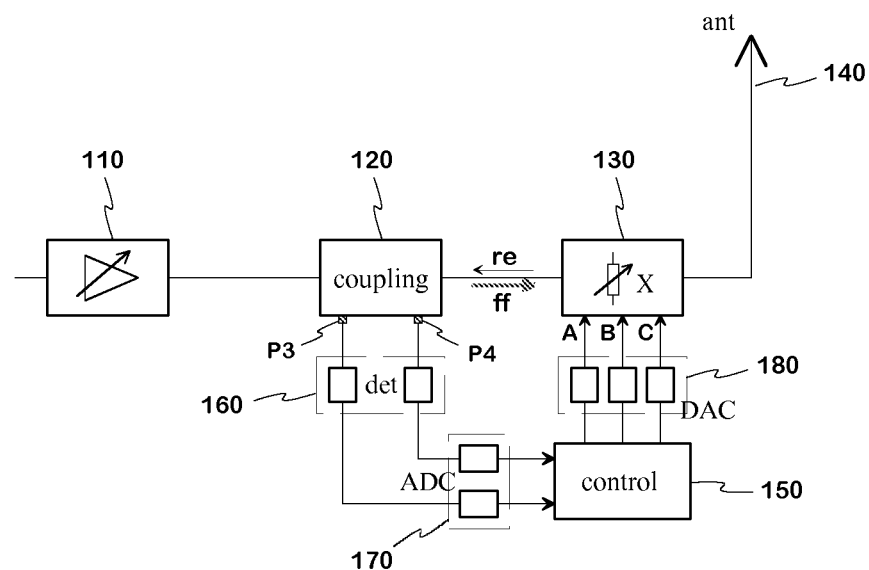

| | | |
|---|---|---|
| 4,028,652 A | 6/1977 | Wakino et al. |
| 4,031,468 A | 6/1977 | Ziebell et al. |
| 4,054,874 A | 10/1977 | Oltman |
| 4,069,483 A | 1/1978 | Kaloi |
| 4,123,756 A | 10/1978 | Nagata et al. |
| 4,123,758 A | 10/1978 | Shibano et al. |
| 4,131,893 A | 12/1978 | Munson et al. |
| 4,201,960 A | 5/1980 | Skutta et al. |
| 4,255,729 A | 3/1981 | Fukasawa et al. |
| 4,313,121 A | 1/1982 | Campbell et al. |
| 4,356,492 A | 10/1982 | Kaloi |
| 4,370,657 A | 1/1983 | Kaloi |
| 4,423,396 A | 12/1983 | Makimoto et al. |
| 4,431,977 A | 2/1984 | Sokola et al. |
| 4,546,357 A | 10/1985 | Laughon et al. |
| 4,559,508 A | 12/1985 | Nishikawa et al. |
| 4,625,212 A | 11/1986 | Oda et al. |
| 4,652,889 A | 3/1987 | Bizouard et al. |
| 4,661,992 A | 4/1987 | Garay et al. |
| 4,692,726 A | 9/1987 | Green et al. |
| 4,703,291 A | 10/1987 | Nishikawa et al. |
| 4,706,050 A | 11/1987 | Andrews |
| 4,716,391 A | 12/1987 | Moutrie et al. |
| 4,740,765 A | 4/1988 | Ishikawa et al. |
| 4,742,562 A | 5/1988 | Kommrusch |
| 4,761,624 A | 8/1988 | Igarashi et al. |
| 4,800,348 A | 1/1989 | Rosar et al. |
| 4,800,392 A | 1/1989 | Garay et al. |
| 4,821,006 A | 4/1989 | Ishikawa et al. |
| 4,823,098 A | 4/1989 | DeMuro et al. |
| 4,827,266 A | 5/1989 | Sato et al. |
| 4,829,274 A | 5/1989 | Green et al. |
| 4,862,181 A | 8/1989 | PonceDeLeon et al. |
| 4,879,533 A | 11/1989 | De Muro et al. |
| 4,896,124 A | 1/1990 | Schwent |
| 4,954,796 A | 9/1990 | Green et al. |
| 4,965,537 A | 10/1990 | Kommrusch |
| 4,977,383 A | 12/1990 | Niiranen |
| 4,980,694 A | 12/1990 | Hines |
| 5,017,932 A | 5/1991 | Ushiyama et al. |
| 5,047,739 A | 9/1991 | Kuokkanene |
| 5,053,786 A | 10/1991 | Silverman et al. |
| 5,097,236 A | 3/1992 | Wakino et al. |
| 5,103,197 A | 4/1992 | Turunen |
| 5,109,536 A | 4/1992 | Kommrusch |
| 5,155,493 A | 10/1992 | Thursby et al. |
| 5,157,363 A | 10/1992 | Puurunen |
| 5,159,303 A | 10/1992 | Flink |
| 5,166,697 A | 11/1992 | Viladevall et al. |
| 5,170,173 A | 12/1992 | Krenz et al. |
| 5,203,021 A | 4/1993 | Repplinger et al. |
| 5,210,510 A | 5/1993 | Karsikas |
| 5,210,542 A | 5/1993 | Pett et al. |
| 5,220,335 A | 6/1993 | Huang |
| 5,229,777 A | 7/1993 | Doyle |
| 5,239,279 A | 8/1993 | Turunen |
| 5,278,528 A | 1/1994 | Turunen |
| 5,281,326 A | 1/1994 | Galla |
| 5,298,873 A | 3/1994 | Ala-Kojola |
| 5,302,924 A | 4/1994 | Jantunen |
| 5,304,968 A | 4/1994 | Ohtonen |
| 5,307,036 A | 4/1994 | Turunen |
| 5,319,328 A | 6/1994 | Turunen |
| 5,349,315 A | 9/1994 | Ala-Kojola |
| 5,349,700 A | 9/1994 | Parker |
| 5,351,023 A | 9/1994 | Niiranen |
| 5,354,463 A | 10/1994 | Turunen |
| 5,355,142 A | 10/1994 | Marshall et al. |
| 5,357,262 A | 10/1994 | Blaese |
| 5,363,114 A | 11/1994 | Shoemaker |
| 5,369,782 A | 11/1994 | Kawano et al. |
| 5,382,959 A | 1/1995 | Pett et al. |
| 5,386,214 A | 1/1995 | Sugawara |
| 5,387,886 A | 2/1995 | Takalo |
| 5,394,162 A | 2/1995 | Korovesis et al. |
| RE34,898 E | 4/1995 | Turunen |
| 5,408,206 A | 4/1995 | Turunen |
| 5,418,508 A | 5/1995 | Puurunen |
| 5,432,489 A | 7/1995 | Yrjola |
| 5,438,697 A | 8/1995 | Fowler et al. |
| 5,440,315 A | 8/1995 | Wright et al. |
| 5,442,280 A | 8/1995 | Baudart |
| 5,442,366 A | 8/1995 | Sanford |
| 5,444,453 A | 8/1995 | Lalezari |
| 5,467,065 A | 11/1995 | Turunen |
| 5,473,295 A | 12/1995 | Turunen |
| 5,506,554 A | 4/1996 | Ala-Kojola |
| 5,508,668 A | 4/1996 | Prokkola |
| 5,517,683 A | 5/1996 | Collett et al. |
| 5,521,561 A | 5/1996 | Yrjola |
| 5,532,703 A | 7/1996 | Stephens et al. |
| 5,541,560 A | 7/1996 | Turunen |
| 5,541,617 A | 7/1996 | Connolly et al. |
| 5,543,764 A | 8/1996 | Turunen |
| 5,550,519 A | 8/1996 | Korpela |
| 5,557,287 A | 9/1996 | Pottala et al. |
| 5,557,292 A | 9/1996 | Nygren et al. |
| 5,570,071 A | 10/1996 | Ervasti |
| 5,585,771 A | 12/1996 | Ervasti |
| 5,585,810 A | 12/1996 | Tsuru et al. |
| 5,589,844 A | 12/1996 | Belcher et al. |
| 5,594,395 A | 1/1997 | Niiranen |
| 5,604,471 A | 2/1997 | Rattila |
| 5,627,502 A | 5/1997 | Ervasti |
| 5,649,316 A | 7/1997 | Prodhomme et al. |
| 5,668,561 A | 9/1997 | Perrotta et al. |
| 5,675,301 A | 10/1997 | Nappa |
| 5,689,221 A | 11/1997 | Niiranen |
| 5,694,135 A | 12/1997 | Dikun et al. |
| 5,703,600 A | 12/1997 | Burrell et al. |
| 5,709,832 A | 1/1998 | Hayes et al. |
| 5,711,014 A | 1/1998 | Crowley et al. |
| 5,717,368 A | 2/1998 | Niiranen |
| 5,731,749 A | 3/1998 | Yrjola |
| 5,734,305 A | 3/1998 | Ervasti |
| 5,734,350 A | 3/1998 | Deming et al. |
| 5,734,351 A | 3/1998 | Ojantakanen |
| 5,739,735 A | 4/1998 | Pyykko |
| 5,742,259 A | 4/1998 | Annamaa |
| 5,757,327 A | 5/1998 | Yajima et al. |
| 5,764,190 A | 6/1998 | Murch et al. |
| 5,767,809 A | 6/1998 | Chuang et al. |
| 5,768,217 A | 6/1998 | Sonoda et al. |
| 5,777,581 A | 7/1998 | Lilly et al. |
| 5,777,585 A | 7/1998 | Tsuda et al. |
| 5,793,269 A | 8/1998 | Ervasti |
| 5,812,094 A | 9/1998 | Maldonado |
| 5,815,048 A | 9/1998 | Ala-Kojola |
| 5,822,705 A | 10/1998 | Lehtola |
| 5,852,421 A | 12/1998 | Maldonado |
| 5,861,854 A | 1/1999 | Kawahata et al. |
| 5,874,926 A | 2/1999 | Tsuru et al. |
| 5,880,697 A | 3/1999 | McCarrick et al. |
| 5,886,668 A | 3/1999 | Pedersen et al. |
| 5,892,490 A | 4/1999 | Asakura et al. |
| 5,903,820 A | 5/1999 | Hagstrom |
| 5,905,475 A | 5/1999 | Annamaa |
| 5,920,290 A | 7/1999 | McDonough et al. |
| 5,926,139 A | 7/1999 | Korisch |
| 5,929,813 A | 7/1999 | Eggleston |
| 5,936,583 A | 8/1999 | Sekine et al. |
| 5,943,016 A | 8/1999 | Snyder, Jr. et al. |
| 5,952,975 A | 9/1999 | Pedersen et al. |
| 5,959,583 A | 9/1999 | Funk |
| 5,963,180 A | 10/1999 | Leisten |
| 5,966,097 A | 10/1999 | Fukasawa et al. |
| 5,970,393 A | 10/1999 | Khorrami et al. |
| 5,977,710 A | 11/1999 | Kuramoto et al. |
| 5,986,606 A | 11/1999 | Kossiavas et al. |
| 5,986,608 A | 11/1999 | Korisch et al. |
| 5,990,848 A | 11/1999 | Annamaa |
| 5,999,132 A | 12/1999 | Kitchener et al. |
| 6,005,529 A | 12/1999 | Hutchinson |
| 6,006,419 A | 12/1999 | Vandendolder et al. |
| 6,008,764 A | 12/1999 | Ollikainen |
| 6,009,311 A | 12/1999 | Killion et al. |
| 6,014,106 A | 1/2000 | Annamaa |

| | | | |
|---|---|---|---|
| 6,016,130 A | 1/2000 | Annamaa | |
| 6,023,608 A | 2/2000 | Yrjola | |
| 6,031,496 A | 2/2000 | Kuittinen et al. | |
| 6,034,637 A | 3/2000 | McCoy et al. | |
| 6,037,848 A | 3/2000 | Alila | |
| 6,043,780 A | 3/2000 | Funk et al. | |
| 6,072,434 A | 6/2000 | Papatheodorou | |
| 6,078,231 A | 6/2000 | Pelkonen | |
| 6,091,363 A | 7/2000 | Komatsu et al. | |
| 6,097,345 A | 8/2000 | Walton | |
| 6,100,849 A | 8/2000 | Tsubaki et al. | |
| 6,112,108 A | 8/2000 | Tepper et al. | |
| 6,133,879 A | 10/2000 | Grangeat et al. | |
| 6,134,421 A | 10/2000 | Lee et al. | |
| 6,140,973 A | 10/2000 | Annamaa | |
| 6,147,650 A | 11/2000 | Kawahata et al. | |
| 6,157,819 A | 12/2000 | Vuokko | |
| 6,177,908 B1 | 1/2001 | Kawahata | |
| 6,185,434 B1 | 2/2001 | Hagstrom | |
| 6,190,942 B1 | 2/2001 | Wilm et al. | |
| 6,195,049 B1 | 2/2001 | Kim et al. | |
| 6,204,826 B1 | 3/2001 | Rutkowski et al. | |
| 6,215,376 B1 | 4/2001 | Hagstrom | |
| 6,246,368 B1 | 6/2001 | Deming et al. | |
| 6,252,552 B1 | 6/2001 | Tarvas et al. | |
| 6,252,554 B1 | 6/2001 | Isohatala | |
| 6,255,994 B1 | 7/2001 | Saito | |
| 6,259,029 B1 | 7/2001 | Hand | |
| 6,268,831 B1 | 7/2001 | Sanford | |
| 6,297,776 B1 | 10/2001 | Pankinaho | |
| 6,304,220 B1 | 10/2001 | Herve et al. | |
| 6,308,720 B1 | 10/2001 | Modi | |
| 6,316,975 B1 | 11/2001 | O'Toole et al. | |
| 6,323,811 B1 | 11/2001 | Tsubaki | |
| 6,326,921 B1 | 12/2001 | Egorov et al. | |
| 6,337,663 B1 | 1/2002 | Chi-Minh | |
| 6,340,954 B1 | 1/2002 | Annamaa et al. | |
| 6,342,859 B1 | 1/2002 | Kurz et al. | |
| 6,346,914 B1 | 2/2002 | Annamaa | |
| 6,348,892 B1 | 2/2002 | Annamaa | |
| 6,353,443 B1 | 3/2002 | Ying | |
| 6,366,243 B1 | 4/2002 | Isohatala | |
| 6,377,827 B1 | 4/2002 | Rydbeck | |
| 6,380,905 B1 | 4/2002 | Annamaa | |
| 6,396,444 B1 | 5/2002 | Goward et al. | |
| 6,404,394 B1 | 6/2002 | Hill | |
| 6,417,813 B1 | 7/2002 | Durham | |
| 6,423,915 B1 | 7/2002 | Winter | |
| 6,429,818 B1 | 8/2002 | Johnson et al. | |
| 6,452,551 B1 | 9/2002 | Chen | |
| 6,452,558 B1 | 9/2002 | Saitou et al. | |
| 6,456,249 B1 | 9/2002 | Johnson et al. | |
| 6,459,413 B1 | 10/2002 | Tseng et al. | |
| 6,462,716 B1 | 10/2002 | Kushihi | |
| 6,469,673 B2 | 10/2002 | Kaiponen | |
| 6,473,056 B2 | 10/2002 | Annamaa | |
| 6,476,769 B1 | 11/2002 | Lehtola | |
| 6,480,155 B1 | 11/2002 | Eggleston | |
| 6,501,425 B1 | 12/2002 | Nagumo | |
| 6,518,925 B1 | 2/2003 | Annamaa | |
| 6,529,168 B2 | 3/2003 | Mikkola | |
| 6,535,170 B2 | 3/2003 | Sawamura et al. | |
| 6,538,604 B1 | 3/2003 | Isohatala | |
| 6,549,167 B1 | 4/2003 | Yoon | |
| 6,556,812 B1 | 4/2003 | Pennanen et al. | |
| 6,566,944 B1 | 5/2003 | Pehlke | |
| 6,580,396 B2 | 6/2003 | Lin | |
| 6,580,397 B2 | 6/2003 | Lindell | |
| 660,449 A1 | 7/2003 | Onaka | |
| 6,603,430 B1 | 8/2003 | Hill et al. | |
| 6,606,016 B2 | 8/2003 | Takamine et al. | |
| 6,611,235 B2 | 8/2003 | Barna et al. | |
| 6,614,400 B2 | 9/2003 | Egorov | |
| 6,614,405 B1 | 9/2003 | Mikkonen | |
| 6,634,564 B2 | 10/2003 | Kuramochi | |
| 6,636,181 B2 | 10/2003 | Asano | |
| 6,639,564 B2 | 10/2003 | Johnson | |
| 6,646,606 B2 | 11/2003 | Mikkola | |
| 6,650,295 B2 | 11/2003 | Ollikainen et al. | |
| 6,657,593 B2 | 12/2003 | Nagumo et al. | |
| 6,657,595 B1 | 12/2003 | Phillips et al. | |
| 6,670,926 B2 | 12/2003 | Miyasaka | |
| 6,677,903 B2 | 1/2004 | Wang | |
| 6,683,573 B2 | 1/2004 | Park | |
| 6,693,594 B2 | 2/2004 | Pankinaho et al. | |
| 6,717,551 B1 | 4/2004 | Desclos et al. | |
| 6,727,857 B2 | 4/2004 | Mikkola | |
| 6,734,825 B1 | 5/2004 | Guo et al. | |
| 6,734,826 B1 | 5/2004 | Dai et al. | |
| 6,738,022 B2 | 5/2004 | Klaavo et al. | |
| 6,741,214 B1 | 5/2004 | Kadambi et al. | |
| 6,753,813 B2 | 6/2004 | Kushihi | |
| 6,759,989 B2 | 7/2004 | Tarvas et al. | |
| 6,765,536 B2 | 7/2004 | Phillips et al. | |
| 6,774,853 B2 | 8/2004 | Wong et al. | |
| 6,781,545 B2 | 8/2004 | Sung | |
| 6,801,166 B2 | 10/2004 | Mikkola | |
| 6,801,169 B1 | 10/2004 | Chang et al. | |
| 6,806,835 B2 | 10/2004 | Iwai | |
| 6,819,287 B2 | 11/2004 | Sullivan et al. | |
| 6,819,293 B2 | 11/2004 | De Graauw et al. | |
| 6,825,818 B2 | 11/2004 | Toncich | |
| 6,836,249 B2 | 12/2004 | Kenoun et al. | |
| 6,847,329 B2 | 1/2005 | Ikegaya et al. | |
| 6,856,293 B2 | 2/2005 | Bordi | |
| 6,862,437 B1 | 3/2005 | McNamara | |
| 6,862,441 B2 | 3/2005 | Ella | |
| 6,873,291 B2 | 3/2005 | Aoyama | |
| 6,876,329 B2 | 4/2005 | Milosavljevic | |
| 6,882,317 B2 | 4/2005 | Koskiniemi | |
| 6,891,507 B2 | 5/2005 | Kushihi et al. | |
| 6,897,810 B2 | 5/2005 | Dai et al. | |
| 6,900,768 B2 | 5/2005 | Iguchi et al. | |
| 6,903,692 B2 | 6/2005 | Kivekas | |
| 6,911,945 B2 | 6/2005 | Korva | |
| 6,922,171 B2 | 7/2005 | Annamaa | |
| 6,925,689 B2 | 8/2005 | Folkmar | |
| 6,927,729 B2 | 8/2005 | Legay | |
| 6,937,196 B2 | 8/2005 | Korva | |
| 6,950,066 B2 | 9/2005 | Hendler et al. | |
| 6,950,068 B2 | 9/2005 | Bordi | |
| 6,952,144 B2 | 10/2005 | Javor | |
| 6,952,187 B2 | 10/2005 | Annamaa | |
| 6,958,730 B2 | 10/2005 | Nagumo et al. | |
| 6,961,544 B1 | 11/2005 | Hagstrom | |
| 6,963,308 B2 | 11/2005 | Korva | |
| 6,963,310 B2 | 11/2005 | Horita et al. | |
| 6,967,618 B2 | 11/2005 | Ojantakanen | |
| 6,975,278 B2 | 12/2005 | Song et al. | |
| 6,985,108 B2 | 1/2006 | Mikkola | |
| 6,992,543 B2 | 1/2006 | Luetzelschwab et al. | |
| 6,995,710 B2 | 2/2006 | Sugimoto et al. | |
| 7,023,341 B2 | 4/2006 | Stilp | |
| 7,042,403 B2 | 5/2006 | Colburn et al. | |
| 7,053,841 B2 | 5/2006 | Ponce De Leon et al. | |
| 7,054,671 B2 | 5/2006 | Kaiponen et al. | |
| 7,057,560 B2 | 6/2006 | Erkocevic | |
| 7,081,857 B2 | 7/2006 | Kinnunen | |
| 7,084,831 B2 | 8/2006 | Takagi et al. | |
| 7,099,690 B2 | 8/2006 | Milosavljevic | |
| 7,113,133 B2 | 9/2006 | Chen et al. | |
| 7,119,749 B2 | 10/2006 | Miyata et al. | |
| 7,126,546 B2 | 10/2006 | Annamaa | |
| 7,136,019 B2 | 11/2006 | Mikkola | |
| 7,136,020 B2 | 11/2006 | Leclerc et al. | |
| 7,142,824 B2 | 11/2006 | Kojima et al. | |
| 7,148,847 B2 | 12/2006 | Yuanzhu | |
| 7,148,849 B2 | 12/2006 | Lin | |
| 7,148,851 B2 | 12/2006 | Takaki et al. | |
| 7,170,464 B2 | 1/2007 | Tang et al. | |
| 7,176,838 B1 | 2/2007 | Kinezos | |
| 7,180,455 B2 | 2/2007 | Oh et al. | |
| 7,193,574 B2 | 3/2007 | Chiang et al. | |
| 7,205,942 B2 | 4/2007 | Wang et al. | |
| 7,218,280 B2 | 5/2007 | Annamaa | |
| 7,218,282 B2 | 5/2007 | Humpfer et al. | |
| 7,221,327 B2 * | 5/2007 | Toncich | 343/860 |
| 7,224,313 B2 | 5/2007 | McKinzie, III et al. | |

| | | | |
|---|---|---|---|
| 7,230,574 B2 | 6/2007 | Johnson | |
| 7,237,318 B2 | 7/2007 | Annamaa | |
| 7,256,743 B2 | 8/2007 | Korva | |
| 7,274,334 B2 | 9/2007 | O'Riordan et al. | |
| 7,283,097 B2 | 10/2007 | Wen et al. | |
| 7,289,064 B2 | 10/2007 | Cheng | |
| 7,292,200 B2 | 11/2007 | Posluszny et al. | |
| 7,319,432 B2 | 1/2008 | Andersson | |
| 7,330,153 B2 | 2/2008 | Rentz | |
| 7,333,067 B2 | 2/2008 | Hung et al. | |
| 7,339,528 B2 | 3/2008 | Wang et al. | |
| 7,340,286 B2 | 3/2008 | Korva | |
| 7,345,634 B2 | 3/2008 | Ozkar et al. | |
| 7,352,326 B2 | 4/2008 | Korva | |
| 7,358,902 B2 | 4/2008 | Erkocevic | |
| 7,382,319 B2 | 6/2008 | Kawahata et al. | |
| 7,385,556 B2 | 6/2008 | Chung et al. | |
| 7,388,543 B2 | 6/2008 | Vance | |
| 7,391,378 B2 | 6/2008 | Mikkola | |
| 7,405,702 B2 | 7/2008 | Annamaa | |
| 7,417,588 B2 | 8/2008 | Castany et al. | |
| 7,423,592 B2 | 9/2008 | Pros et al. | |
| 7,432,860 B2 | 10/2008 | Huynh | |
| 7,439,929 B2 | 10/2008 | Ozkar | |
| 7,468,700 B2 | 12/2008 | Milosavljevic | |
| 7,468,709 B2 | 12/2008 | Niemi | |
| 7,498,990 B2 | 3/2009 | Park et al. | |
| 7,501,983 B2 | 3/2009 | Mikkola | |
| 7,502,598 B2 | 3/2009 | Kronberger | |
| 7,589,678 B2 | 9/2009 | Perunka | |
| 7,616,158 B2 | 11/2009 | Mark et al. | |
| 7,633,449 B2 | 12/2009 | Oh | |
| 7,663,551 B2 | 2/2010 | Nissinen | |
| 7,679,565 B2 | 3/2010 | Sorvala | |
| 7,692,543 B2 | 4/2010 | Copeland | |
| 7,710,325 B2 | 5/2010 | Cheng | |
| 7,724,204 B2 | 5/2010 | Annamaa | |
| 7,760,146 B2 | 7/2010 | Ollikainen | |
| 7,764,245 B2 | 7/2010 | Loyet | |
| 7,786,938 B2 | 8/2010 | Sorvala | |
| 7,800,544 B2 | 9/2010 | Thornell-Pers | |
| 7,830,327 B2 | 11/2010 | He | |
| 7,889,139 B2 | 2/2011 | Hobson et al. | |
| 7,889,143 B2 | 2/2011 | Milosavljevic | |
| 7,901,617 B2 | 3/2011 | Taylor | |
| 7,916,086 B2 | 3/2011 | Koskiniemi | |
| 7,963,347 B2 | 6/2011 | Pabon | |
| 7,973,720 B2 | 7/2011 | Sorvala | |
| 8,049,670 B2 | 11/2011 | Jung et al. | |
| 8,179,322 B2 | 5/2012 | Nissinen | |
| 2001/0050636 A1 | 12/2001 | Weinberger | |
| 2002/0183013 A1 | 12/2002 | Auckland et al. | |
| 2002/0196192 A1 | 12/2002 | Nagumo et al. | |
| 2003/0146873 A1 | 8/2003 | Blancho | |
| 2004/0090378 A1 | 5/2004 | Dai et al. | |
| 2004/0100341 A1 | 5/2004 | Luetzelschwab et al. | |
| 2004/0145525 A1 | 7/2004 | Annabi et al. | |
| 2004/0171403 A1 | 9/2004 | Mikkola | |
| 2005/0055164 A1 | 3/2005 | Zhang et al. | |
| 2005/0057401 A1 | 3/2005 | Yuanzhu | |
| 2005/0159131 A1 | 7/2005 | Shibagaki et al. | |
| 2005/0176481 A1 | 8/2005 | Jeong | |
| 2006/0071857 A1 | 4/2006 | Pelzer | |
| 2007/0042615 A1 | 2/2007 | Liao | |
| 2007/0082789 A1 | 4/2007 | Nissila | |
| 2007/0152881 A1 | 7/2007 | Chan | |
| 2008/0059106 A1 | 3/2008 | Wight | |
| 2008/0088511 A1 | 4/2008 | Sorvala | |
| 2008/0266199 A1 | 10/2008 | Milosavljevic | |
| 2009/0009415 A1 | 1/2009 | Tanska | |
| 2009/0135066 A1 | 5/2009 | Raappana | |
| 2009/0174604 A1 | 7/2009 | Keskitalo | |
| 2009/0196160 A1 | 8/2009 | Crombach | |
| 2010/0220016 A1 | 9/2010 | Nissinen | |
| 2010/0244978 A1 | 9/2010 | Milosavljevic | |
| 2010/0309092 A1 | 12/2010 | Lambacka | |
| 2011/0102290 A1 | 5/2011 | Milosavljevic | |
| 2011/0133994 A1 | 6/2011 | Korva | |
| 2012/0119955 A1 | 5/2012 | Milosavljevic | |

FOREIGN PATENT DOCUMENTS

| | | |
|---|---|---|
| DE | 10104862 | 8/2002 |
| DE | 101 50 149 A1 | 4/2003 |
| EP | 0208424 | 1/1987 |
| EP | 0278069 | 8/1988 |
| EP | 0279050 | 8/1988 |
| EP | 0339822 | 3/1989 |
| EP | 0 332 139 | 9/1989 |
| EP | 0 376 643 A2 | 4/1990 |
| EP | 0383292 | 8/1990 |
| EP | 0399975 | 12/1990 |
| EP | 0400872 | 12/1990 |
| EP | 0401839 | 9/1991 |
| EP | 0447218 | 9/1994 |
| EP | 0615285 | 10/1994 |
| EP | 0621653 | 2/1995 |
| EP | 0 749 214 | 12/1996 |
| EP | 0637094 | 1/1997 |
| EP | 0 759 646 A1 | 2/1997 |
| EP | 0 766 341 | 2/1997 |
| EP | 0 766 340 | 4/1997 |
| EP | 0751043 | 4/1997 |
| EP | 0766339 | 4/1997 |
| EP | 0807988 | 11/1997 |
| EP | 0 831 547 A2 | 3/1998 |
| EP | 0851530 | 7/1998 |
| EP | 0856907 | 8/1998 |
| EP | 1 294 048 | 1/1999 |
| EP | 0892459 | 1/1999 |
| EP | 0 942 488 A2 | 9/1999 |
| EP | 1 003 240 A2 | 5/2000 |
| EP | 0999607 | 5/2000 |
| EP | 1006605 | 6/2000 |
| EP | 1006606 | 6/2000 |
| EP | 1014487 | 6/2000 |
| EP | 1024553 | 8/2000 |
| EP | 1026774 | 8/2000 |
| EP | 1 052 723 | 11/2000 |
| EP | 1052722 | 11/2000 |
| EP | 1 063 722 A2 | 12/2000 |
| EP | 1067627 | 1/2001 |
| EP | 1094545 | 4/2001 |
| EP | 1 102 348 | 5/2001 |
| EP | 1098387 | 5/2001 |
| EP | 1 113 524 | 7/2001 |
| EP | 1113524 | 7/2001 |
| EP | 1 128 466 A2 | 8/2001 |
| EP | 1 139 490 | 10/2001 |
| EP | 1 146 589 | 10/2001 |
| EP | 1 162 688 | 12/2001 |
| EP | 1162688 | 12/2001 |
| EP | 1220456 | 3/2002 |
| EP | 0993070 | 4/2002 |
| EP | 1 248 316 | 9/2002 |
| EP | 0923158 | 9/2002 |
| EP | 1 267 441 | 12/2002 |
| EP | 1271690 | 1/2003 |
| EP | 1 294 049 A1 | 3/2003 |
| EP | 1306922 | 5/2003 |
| EP | 1 329 980 | 7/2003 |
| EP | 1 351 334 | 8/2003 |
| EP | 1 361 623 | 11/2003 |
| EP | 1248316 | 1/2004 |
| EP | 1396906 | 3/2004 |
| EP | 1 406 345 | 4/2004 |
| EP | 1 414 108 | 4/2004 |
| EP | 1 432 072 | 6/2004 |
| EP | 1 437 793 | 7/2004 |
| EP | 1439603 | 7/2004 |
| EP | 1 445 822 | 8/2004 |
| EP | 1 453 137 | 9/2004 |
| EP | 1 469 549 | 10/2004 |
| EP | 1220456 | 10/2004 |
| EP | 1467456 | 10/2004 |
| EP | 1 482 592 | 12/2004 |
| EP | 1 498 984 | 1/2005 |
| EP | 1 564 839 | 1/2005 |
| EP | 1170822 | 4/2005 |
| EP | 1 544 943 | 6/2005 |

| | | |
|---|---|---|
| EP | 1753079 | 2/2007 |
| EP | 1 791 213 | 5/2007 |
| EP | 1843432 | 10/2007 |
| FI | 20020829 | 11/2003 |
| FI | 2005/050247 | 6/2005 |
| FI | 2006/050418 | 4/2007 |
| FR | 2553584 | 10/1983 |
| FR | 2873247 | 7/2004 |
| FR | 2873247 | 1/2006 |
| GB | 2046530 | 11/1980 |
| GB | 2266997 | 11/1993 |
| GB | 2 360 422 A | 9/2001 |
| GB | 239246 | 12/2003 |
| JP | 114503 | 7/1983 |
| JP | 52-215807 | 12/1983 |
| JP | 52-215808 | 12/1983 |
| JP | 59202831 | 11/1984 |
| JP | 216601 | 10/1985 |
| JP | 600206304 | 10/1985 |
| JP | 101902 | 6/1986 |
| JP | 134605 | 7/1986 |
| JP | 61245704 | 11/1986 |
| JP | 6007204 | 1/1989 |
| JP | 03 280625 | 12/1991 |
| JP | 06152463 | 5/1994 |
| JP | 7131234 | 5/1995 |
| JP | 7221536 | 8/1995 |
| JP | 7249923 | 9/1995 |
| JP | 07307612 | 11/1995 |
| JP | 08216571 | 8/1996 |
| JP | 09083242 | 3/1997 |
| JP | 9260934 | 10/1997 |
| JP | 9307344 | 11/1997 |
| JP | 10 028013 | 1/1998 |
| JP | 10107671 | 4/1998 |
| JP | 10173423 | 6/1998 |
| JP | 10 209733 | 8/1998 |
| JP | 10224142 | 8/1998 |
| JP | 10 327011 | 12/1998 |
| JP | 10322124 | 12/1998 |
| JP | 11 004117 | 1/1999 |
| JP | 114113 | 1/1999 |
| JP | 11 068456 | 3/1999 |
| JP | 11127010 | 5/1999 |
| JP | 11127014 | 5/1999 |
| JP | 11136025 | 5/1999 |
| JP | 11 355033 | 12/1999 |
| JP | 2000278028 | 10/2000 |
| JP | 200153543 | 2/2001 |
| JP | 2001267833 | 9/2001 |
| JP | 2001217631 | 10/2001 |
| JP | 2001326513 | 11/2001 |
| JP | 2002319811 A | 10/2002 |
| JP | 2002329541 | 11/2002 |
| JP | 2002335117 | 11/2002 |
| JP | 200360417 | 2/2003 |
| JP | 2003124730 | 4/2003 |
| JP | 2003179426 | 6/2003 |
| JP | 2003318638 | 11/2003 |
| JP | 2004112028 | 4/2004 |
| JP | 2004363859 | 12/2004 |
| JP | 2005005985 | 1/2005 |
| JP | 2005252661 | 9/2005 |
| KR | 20010080521 | 8/2001 |
| KR | 10-2006-7027462 | 12/2002 |
| KR | 20020096016 | 12/2002 |
| SE | 511900 | 12/1999 |
| WO | WO 1992/00635 | 1/1992 |
| WO | WO 96/27219 | 9/1996 |
| WO | WO 98/01919 | 1/1998 |
| WO | WO 1998/01921 | 1/1998 |
| WO | WO 98/37592 | 9/1998 |
| WO | WO 99/30479 | 6/1999 |
| WO | WO 00/36700 | 6/2000 |
| WO | WO 00/34916 | 8/2000 |
| WO | WO 01/20718 | 3/2001 |
| WO | WO 01/24316 | 4/2001 |
| WO | WO 01/28035 | 4/2001 |
| WO | WO 01/29927 | 4/2001 |
| WO | WO 01/33665 | 5/2001 |
| WO | WO 01/61781 | 8/2001 |
| WO | WO 01/91236 | 11/2001 |
| WO | WO 02/08672 | 1/2002 |
| WO | WO 02/11236 A1 | 2/2002 |
| WO | WO 02/13307 | 2/2002 |
| WO | WO 02/41443 | 5/2002 |
| WO | WO 02/067375 | 8/2002 |
| WO | WO 02/078123 | 10/2002 |
| WO | WO 02/078124 | 10/2002 |
| WO | WO 03/094290 | 11/2003 |
| WO | WO 2004/017462 | 2/2004 |
| WO | WO 2004/036778 | 4/2004 |
| WO | WO 2004/057697 | 7/2004 |
| WO | WO 2004/070872 | 8/2004 |
| WO | WO 2004/100313 | 11/2004 |
| WO | WO 2004/112189 A | 12/2004 |
| WO | WO 2005/011055 | 2/2005 |
| WO | WO 2005/018045 | 2/2005 |
| WO | WO 2005/034286 | 4/2005 |
| WO | WO 2005/038981 A1 | 4/2005 |
| WO | WO 2005/055364 | 6/2005 |
| WO | WO 2005/062416 | 7/2005 |
| WO | WO 2006/000631 A1 | 1/2006 |
| WO | WO 2006/000650 | 1/2006 |
| WO | WO 2006/051160 A1 | 5/2006 |
| WO | WO 2006/084951 A1 | 8/2006 |
| WO | WO 2006/097567 | 9/2006 |
| WO | WO 2007/000483 | 1/2007 |
| WO | WO 2007/000483 A1 | 1/2007 |
| WO | WO 2007/012697 | 1/2007 |
| WO | WO 2007/012697 | 2/2007 |
| WO | 2007/042615 | 4/2007 |
| WO | WO 2007/039667 | 4/2007 |
| WO | WO 2007/039668 | 4/2007 |
| WO | WO 2007/042614 | 4/2007 |
| WO | WO 2007/042615 | 4/2007 |
| WO | WO 2007/050600 | 5/2007 |
| WO | WO 2007/080214 | 7/2007 |
| WO | WO 2007/098810 | 9/2007 |
| WO | WO 2007/138157 | 12/2007 |
| WO | WO 2008/059106 | 3/2008 |
| WO | WO 2008/129125 | 10/2008 |
| WO | WO 2009/027579 | 5/2009 |
| WO | WO 2009/095531 | 8/2009 |
| WO | WO 2009/106682 | 9/2009 |

OTHER PUBLICATIONS

"Dual Band Antenna for Hand Held Portable Telephones", Liu et al., Electronics Letters, vol. 32, No. 7, 1996, pp. 609-610.
"Improved Bandwidth of Microstrip Antennas using Parasitic Elements," IEE Proc. vol. 127, Pt. H. No. 4, Aug. 1980.
"Transactions on Antennas and Propagation," IEEE vol. 43, No. 3, Mar. 1995.
"A 13.56MHz RFID Device and Software for Mobile Systems", by H. Ryoson, et al., Micro Systems Network Co., 2004 IEEE, pp. 241-244.
"A Novel Approach of a Planar Multi-Band Hybrid Series Feed Network for Use in Antenna Systems Operating at Millimeter Wave Frequencies," by M.W. Elsallal and B.L. Hauck, Rockwell Collins, Inc., 2003 pp. 15-24, waelsall@rockwellcollins.com and blhauck@rockwellcollins.com.
A Finnish Search Report, dated Sep. 18, 2003, which issued during the prosecution of Finnish Application No. 20030059 which corresponds to the present application.
A Finnish Search Report, dated Sep. 23, 2003, which issued during the prosecution of Finnish Application No. 20030093 which corresponds to the present application.
A Finnish Search Report, dated Sep. 26, 2003, which issued during the prosecution of Finnish Application No. 20030193 which corresponds to the present application.
Abedin, M. F. And M. Ali, \Modifying the ground plane and its eItect on planar inverted-F antennas (PIFAs) for mobile handsets, *IEEE Antennas and Wireless Propagation Letters*, vol. 2, 226{229, 2003.
Balanis, C. A., "Antenna Theory Analysis and Design," John Wiley & Sons, Inc., 1997.

C. R. Rowell and R. D. Murch, "A compact PIFA suitable for dual frequency 900/1800-MHz operation," *IEEE Trans. Antennas Propag.*, vol. 46, No. 4, pp. 596-598, Apr. 1998.

Cheng-Nan Hu, Willey Chen, and Book Tai, "A Compact Multi-Band Antenna Design for Mobile Handsets", *APMC* 2005 *Proceedings*.

Endo, T., Y. Sunahara, S. Satoh and T. Katagi, "Resonant Frequency and Radiation Efficiency of Meander Line Antennas," Electronics and Commu-nications in Japan, Part 2, vol. 83, No. 1, 52-58, 2000.

European Office Action, May 30, 2005 issued during prosecution of EP 04 396 001.-1248.

Examination Report dated May 3, 2006 issued by the EPO for European Patent Application No. 04 396 079.8.

F.R. Hsiao, et al. "A dual-band planar inverted-F patch antenna with a branch-line slit," *Microwave Opt. Technol. Lett.*, vol. 32, Feb. 20, 2002.

Front page of EP 1024553 A2, which corresponds to US Patent Publication No. 2001/0050636 A1 listed above.

Front page of EP 1026774 A3, which corresponds to US Patent Publication No. 2001/0050635 A1 listed above.

Griffin, Donald W. et al,, "Electromagnetic Design Aspects of Packages for Monolithic Microwave Integrated Circuit-Based Arrays with Integrated Antenna Elements", IEEE Transactions on Antennas and Propagation, vol. 43, No. 9, pp. 927-931, Sep. 1995.

Guo, Y. X. and H. S. Tan, \New compact six-band internal antenna, *IEEE Antennas and Wireless Propagation Letters*, vol. 3, 295-297, 2004.

Guo, Y. X. And Y.W. Chia and Z. N. Chen, "Miniature built-in quadband antennas for mobile handsets", *IEEE Antennas Wireless Propag. Left.*, vol. 2, pp. 30-32, 2004.

Hall, P.S., "System Applications: The Challenge for Active Integrated Antennas", The University of Birmingham, Edgbaston, Birmingham, UK, undated (5 pp.).

Hoon Park, et al. "Design of an Internal antenna with wide and multiband characteristics for a mobile handset", IEEE 1't r: 0 iii.

Hoon Park, et al. Design of Planar Inverted-F Antenna With Very Wide Impedance Bandwidth', *IEEE Microw. & Wireless Comp., Lett.*, vol. 16, No. 3, pp. 113-115-, Mar., 2006.

Hossa, R., A. Byndas, and M. E. Bialkowski, \Improvement of compact internal antenna performance by incorporating open-end slots in ground plane, *IEEE Microwave and Wireless Components Letters*, vol. 14, 283{285, 2004.

I. Ang, Y. X. Guo, and Y. W. Chia, "Compact internal quad-band antenna for mobile phones" *Micro. Opt. Technol. Lett.*, vol. 38, No. 3 pp. 217-223 Aug. 2003.

International: Preliminary Report on Patentability for International Application No. PCT/FI20041000554, date of issuance of report May 1, 2006.

Japanese patent document No. JP10224142—English translation of the abstract enclosed.

Japanese patent document No. JP9307344—English translation of the Abstract enclosed.

Jing, X., et al.; "Compact Planar Monopole Antenna for Multi-Band Mobile Phones"; Microwave Conference Proceedings, 4.-7.12.2005. APMC 2005, Asia-Pacific Conference Proceedings, vol. 4.

Kim, B. C., J. H. Yun, and H. D. Choi, \Small wideband PIFA for mobile phones at 1800 MHz, *IEEE International Conference on Vehicular Technology*, 27{29, Daejeon, South Korea, May 2004.

Kim, Kihong et al., "integrated Dipole Antennas on Silicon Substrates for Intra-Chip Communication", IEEE, pp. 1582-1585, 1999.

Kivekas., O., J. Ollikainen, T. Lehtiniemi, and P. Vainikainen, \Bandwidth, SAR, and e±ciency of internal mobile phone antennas, *IEEE Transactions on Electromagnetic Compatibility*, vol. 46, 71{86, 2004.

K-L Wong, *Planar Antennas for Wireless Communications.*, Hoboken, NJ: Willey, 2003, ch. 2.

Kunz, K. S., R. J. Ruebbers, "The Finite Differ-ence Time Domain Method for Electromagnetics", CRC Press, 1993.

Lindberg., P. and E. Ojefors, \A bandwidth enhancement technique for mobile handset anten-nas using wavetraps, *IEEE Transactions on Antennas and Propagation*, vol. 54, 2226{2232, 2006.

Marta Martinez—Vazquez, et al., "Integrated Planar Multiband Antennas for Personal Communication Handsets", *IEEE Trasactions on Antennas and propagation*, vol. 54, No. 2, Feb. 2006.

Matthaei et al., Microwave Filters, Impedance—Mathing Networks and Coupling Structures, McGraw-Hill, pp. 497-506 & 733-737 (1964).

*Mobile antenna Systems Handbook*, $2^{nd}$ ed., K. Fujimoto and R.J. James, Eds., Artech House, Norwood, MA, 2001.

Nagle, High Frequency Diversity Receiver From the 1930's, Ham Radio, pp. 34-43 (Apr. 1990).

O. Kivekäs, et al.; "Frequency-tunable internal antenna for mobile phones", Proceedings of 12èmes Journées internationales de Nice sur les Antennes, $12^{th}$ Int'l Symposium on Antennas (JINA 2002), vol. 2, 2002, Nice, France, s.53-56, tiivistelmä.

P. Ciais, et al., "Compact Internal Multiband Antennas for Mobile and WLAN Standards", *Electronic Letters*, vol. 40, No. 15, pp. 920-921, Jul. 2004.

P. Ciais, R. Staraj, G. Kossiavas, and C. Luxey, "Design of an internal quadband antenna for mobile phones", *IEEE Microwave Wireless Comp. Lett.*, vol. 14, No. 4, pp. 148-150, Apr. 2004.

P. Salonen, et al. "New slot configurations for dual-band planar inverted-F antenna," *Microwave Opt. Technol.*, vol. 28, pp. 293-298, 2001.

Papapolymerou, loannis et al., "Micromachined Patch Antennas", IEEE Transactions on Antennas and Propagation, vol. 46, No. 2, pp. 275-283, Feb. 1998.

Park, J. D., N. Kim, "SAR Analysis on Human Head Caused by PCS Handheld Telephone," BEMS 21th Annual Meeting, 166-167, 1999.

Patent Abstracts of Japan, vol. 1999, No. 10, Aug. 31, 1999, Application JP 11 127010 (Sony Corp.).

Patent Abstracts of Japan—vol. 12, No. 106 (E-14 596)(2953) Apr. 6, 1988 & JP-A-62 235 801 (Fuji Electrochem Co. Ltd.) Oct. 16, 1987.

Patent Abstracts of Japan—vol. 14, No. 297, (E-945) Jun. 27, 1990 & JP-A-2-094 901 (Toko Inc.) Apr. 5, 1990.

Patent Abstracts of Japan—vol. 5, No. 11 (E-42)(683) Jan. 23, 1981 & JP-A-55 141 802 (Alps Denki K.K.) Nov. 6, 1980.

Patent Abstracts of Japan—vol. 7, No. 292 (E-219)(1437) Dec. 27, 1983 & JP-A-58-168 302 (Fujitsu K.K.) Oct. 4, 1983.

Product of the Month, RFDesign, "GSM/GPRS Quad Band Power Amp Includes Antenna Switch," 1 page, reprinted Nov. 2004, issue of RF Design (www.rfdesign.com), Copyright 2004, Freescale Semiconductor, RFD-24-EK.

Q.-H. Jin, S.-S Dai, and K.-M. Huang, Microwave chemistry, Science Press, Beijing, 1999.

Q.-H, Jin, S.-S Dai, and K.-M. Huang, Microwave chemistry, Science Press, Beijing, 1999.

S. Tarvas, et al. "An internal dual-band mobile phone antenna," in 2000 *IEEE Antennas Propagat. Soc. Int. Symp. Dig.*, pp. 266-269, Salt Lake City, UT, USA.

Wang, F., Z. Du, Q. Wang, and K. Gong, \Enhanced-bandwidth Pifa with T-shaped ground plane, *Electronics Letters*, vol. 40, 1504{1505, 2004.

Wang, H.; "Dual-Resonance Monopole Antenna with Tuning Stubs"; IEEE Proceedings, Microwaves, Antennas & Propagation, vol. 153, No. 4, Aug. 2006; pp. 395-399.

Wong, K., et al.; "A Low-Profile Planar Monopole Antenna for Multiband Operation of Mobile Handsets"; IEEE Transactions on Antennas and Propagation, Jan. 2003, vol. 51, No. 1.

X.-D. Cai and J.-Y. Li, Analysis of asymmetric TEM cell and its optimum design of electric field distribution, IEE Proc 136 (1989), 191-194.

X.-Q. Yang and K.-M. Huang, Study on the key problems of interaction between microwave and chemical reaction, Chin J of Radio Sci 21 (2006), 802-809.

Ying-Xin Guo, Irene Ang., and M. Y. W. Chia, "Compact Internal Multiband Antennas for Mobile Handsets", *IEEE Antennas and Wireless propagation Letters*, vol. 2, pp. 143-146, 2003.

Yong-Xin Guo, et al. "New Compact Six-Band Internal Antenna," *IEEE Antennas and Wireless Propagation Letters*, vol. 3, pp. 295-297, 2004.

Z.-B. Zhang, L.-X. Zhou, Y.-R. Li, C.-H. Yan, and M. Zhang, The synthesis of diphenylthiourea under irradiation of different frequency microwave, J Yangzhou Univ (Natural Science Edition), 3 (2000), 14-16.

\* cited by examiner

US 8,466,756 B2

METHODS AND APPARATUS FOR MATCHING AN ANTENNA

PRIORITY AND RELATED APPLICATIONS

This application is a National Stage Application of, and claims priority to, International Application No. PCT/FI2008/050200 under 35 U.S.C. 371, filed Apr. 17, 2008, which claims the benefit of priority to Finnish Patent Application Ser. No. 20075269, filed on Apr. 19, 2007, the priority benefit of which is also herein claimed, each of the foregoing being incorporated herein by reference in its entirety.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

1. Field of Invention

The invention relates to the matching of the antenna of a radio device in transmitting condition, and it includes both a matching method and arrangement. The invention is intended especially for small-sized mobile terminals.

2. Description of Related Technology

Matching the impedance of the antenna of a radio device to the power amplifier of the transmitter feeding the antenna is a normal arrangement in transmission technology. By means of the matching, the radiation power of the antenna can be made as high as possible in proportion to the power of the power amplifier. The poorer the matching of the antenna, the higher the strength of the field reflected from the antenna towards the power amplifier in proportion to the strength of the field propagating towards the antenna. If a certain transmitting power is wanted even though the matching degrades, the gain of the power amplifier has to be raised, which will result in increased current consumption and possibly problems of heating up in the output stage.

The matching of an antenna can degrade for external and internal reasons. If the device approaches some conductive object, the impedance of the antenna changes. Similarly, already the head of a user and the hand, where the mobile terminal usually is during the connection, can cause a significant change in the impedance. Secondly, the internal output impedance of the power amplifier depends on the transmitting power: when the power is raised, the output impedance of the amplifier lowers and vice versa. This means that if the matching is good when the transmitting power has a certain value, a change in the power causes a degradation of the matching. For these facts it is favourable to make the antenna matching adaptable such that it varies to be each time conformable to the circumstances. In this case, the information of the strength of the field reflected from the antenna is used to control the matching circuit so that the antenna matching is all the time as good as possible.

Figure 2:
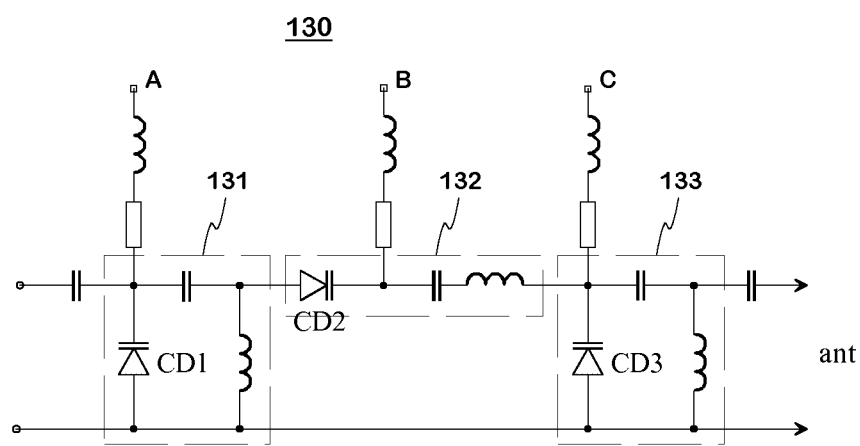

In FIGS. 1 and 2 there is an example of the adaptable matching, known from the publication U.S. Pat. No. 5,778, 308. The figure shows the transmission path of the transmitter as a simplified block diagram. There are, connected in series in the direction of the propagation of the signal, the power amplifier 110 of the transmitter, a directional coupler 120, a reactive matching circuit 130 and the antenna 140. The directional coupler and the matching circuit belong to the antenna's matching arrangement, which further comprises a control unit 150, detectors 160, analog-to-digital converters 170 and digital-to-analog converters 180.

The antenna matching can never be perfect, so a certain part re of the propagating field ff is reflected back. The directional coupler provides two measuring signals: a radio frequency voltage proportional to the reflected field is received from its port P3 and a radio frequency voltage proportional to the propagating field from its port P4. These measuring signals are converted to direct voltages by the detectors 160 and further to binary digits by said AD converters 170. The digital signals provided by the AD converters are led to the control unit 150. The control unit generates three control signals, which are converted to be analog by said DA converters 180. The analog control signals are led to control inputs A, B and C of the matching circuit 130. The control unit can be also analog, in which case the AD and DA converters are naturally not needed.

The principle of the adjustment in FIG. 1 is the following: The control unit 150 computes from the measuring signals provided by the directional coupler the ratio of the reflected and propagating signals, or the reflection coefficient of the antenna, and tries to keep it so low as possible. When the antenna matching degrades for some reason, the control unit searches for the control signals A, B and C such values that the reflection coefficient becomes lower and thus the antenna matching again improves. FIG. 2 shows an example of the structure of the matching circuit 130. The matching circuit comprises three adjustable reactance circuits so that they form a network of π type. In the propagating direction of the transmitting signal there is first the first reactance circuit 131, which is a transverse parallel resonance circuit. Then there is the second reactance circuit 132, which is a longitudinal serial resonance circuit and lastly the third reactance circuit 133, which is a transverse parallel resonance circuit. Each reactance circuit includes a capacitance diode as the adjusting element. The capacitance diode of the first reactance circuit, or the first capacitance diode CD1, is controlled through said control input A, the second capacitance diode CD2 is controlled through the control input B and the third capacitance diode CD3 is controlled through the control input C. Each control signal is led through a coil that the radio frequency signals would not reach the DA converters. In addition, there are blocking capacitors in the transmission path so that each control voltage can proceed only to the capacitance diode to be controlled.

As known, a parallel resonance circuit is inductive at the frequencies below the resonance frequency and capacitive at the frequencies above the resonance frequency. A serial resonance circuit again is capacitive at the frequencies below the resonance frequency and inductive at the frequencies above the resonance frequency. It has been programmed in the control unit 130 the values of the control voltage for each reactance circuit, which correspond to its resonance condition and to some capacitance and inductance values. Consequently the search process of the optimum matching in transmitting condition goes on as follows: First e.g. the first reactance circuit 131 is set to the resonance condition, in which case it represents a high impedance and therefore does not at all effect on the matching, and the second reactance circuit 132 is set to correspond a certain capacitance. The reactance of the third reacrance circuit 133 is changed step by step from a certain capacitive value to a certain inductive value, and the value of the reflection coefficient is calculated in each step. At second stage the second reactance circuit is set to correspond a certain inductance, the reactance of the third reactance circuit is again changed step by step from a certain capacitive value to a certain inductive value and the value of the reflection coefficient is calculated in each step. At third stage the third reactance circuit 133 is set to the resonance condition, in which case it represents a high impedance and therefore does not at all effect on the matching, and the second reactance circuit 132 is set to correspond a certain capacitance. The reactance of the first reactance circuit 131 is changed step by step from a certain capacitive value to a certain inductive value, and the value of the reflection coefficient is calculated in each step. At fourth stage the second reactance circuit is set to correspond a certain inductance, the reactance of the first reactance circuit is again changed step by step from a certain capacitive value to a certain inductive value and the value of the reflection coefficient is calculated in each step. From all reflection coefficient values thus obtained the lowest one is selected, and a respective control is inputted to the matching circuit. The process is started for example two times in a second. If the reflection coefficient is lower than a determined lower limit, the process is not executed. On the other hand, if the reflection coefficient is higher than a determined upper limit, the control unit again does not execute the process, but gives an alarm.

The capacitance diodes to be used in the solution described before result in drawbacks: The matching circuit according to the solution is poorly suitable for the transmitter, because its capacitance diodes do not function acceptably when the power is relatively high. In addition, the losses caused by them are remarkable also when the power is low. Moreover, a serial diode causes reflections in practice, because this kind of semiconductors are designed for the impedance level of 50Ω, and the output impedance of a power amplifier is normally remarkably lower. A drawback of the above-described solution is also that it includes a relatively complex adjusting algorithm.

An object of the invention is to implement the antenna matching in a new way so that the above-mentioned drawbacks are reduced.

In one aspect of the invention, the antenna impedance in the output of the power amplifier of a transmitter is adjusted by means of a π-shaped reactive matching circuit, the component values of which can be selected from a relatively wide array of the alternatives. In one embodiment, the component values are selected by means of the multiple-way switches, which only are located in the transverse branches of the matching circuit. The switches are set by the control unit, input variables of which being the SWR value provided by the directional coupler, the operating band used each time and a value of the transmitting power. The matching is based on an adjusting process to be executed at regular intervals, in which process the control unit tries different combinations of the switch states and finally selects the combination, which brings the lowest SWR value. In the beginning of the adjusting process the control unit reduces, on grounds of the current values of the input variables, the number of the combinations to be tried.

An advantage of the invention is that the mean efficiency of the transmitter in a certain period improves. This is due to the fact that in the arrangement according to the invention the antenna matching maintains relatively good, although the internal output impedance of the amplifier and the impedance from the output towards the antenna would strive to differ from each other for external reasons or a band changing. Also the impedance changes due to the changes in the transmitting power can be taken into account. The improvement of the efficiency results in that the current consumption of the radio device decreases and the power amplifier does not heat up so much. The efficiency remains relatively good also for the fact that the adjusting components are low-loss switches and no adjusting component is located in series in the transmission path. A further advantage of the invention is that the adjusting algorithm of the antenna impedance is relatively simple and fast. This is due to the fact that the most of the combinations of the switch states can be immediately removed on grounds of the input information of the control unit of the matching circuit.

In another aspect of the invention, a method for matching an antenna of a radio device is disclosed. In one embodiment, the antenna is associated with a radio device in which a standing wave ratio (SWR) value of a signal to be transmitted in a transmission path of the antenna is provided and a reactive pi-shaped matching circuit in the transmission path between a power amplifier of a transmitter and the antenna is adjusted to optimize a load impedance of the power amplifier, the matching circuit adjusted by a plurality of multiple-way switching elements located in transverse portions associated with the matching circuit, said method comprising: reading an information associated with an operating band that is in use; defining a trial array comprised of a subset of state combinations, said trial array being substantially smaller than a total array of a plurality of state combinations of said multiple-way switching elements, said act of defining utilizing at least a certain value of the transmitting power, said information associated with the operating band that is in use, and the SWR value; setting the switching elements of the matching circuit to each of the states associated with the subset of state combinations of the trial array; determining the SWR value of the signal to be transmitted in each state and determining the lowest one of the SWR values determined; setting the switches of the matching circuit to the state corresponding to the lowest one of the SWR values determined; and repeating the acts of reading, defining, determining and setting at a regular interval.

In one variant, said certain value of the transmitting power comprises a current set value of the transmitting power.

In another variant, said trial array is defined according to the method comprising: addressing a memory by means of at least the information associated with the operating band that is in use, the memory including a plurality of optimal state combinations for different operating bands and at least one transmitting power based on measurements made with the radio device; setting the states of the switching elements in the matching circuit in accordance with the state combination retrieved from said memory; reading the SWR value of the signal to be transmitted; defining based at least in part on the read SWR value and current switching element states a first state combination which is arranged to correct a matching error if it is inductive, and a second state combination, which is arranged to correct the matching error if it is capacitive; and determining the SWR values of the signal to be transmitted corresponding to the first and second state combinations.

The trial array comprises of e.g., the first state combination correcting an inductive matching error, and the second state combination correcting a capacitive matching error.

The adjustment of the matching circuit is made in another variant more accurate by defining at least two state combinations which are arranged to correct inductive or capacitive matching error based on the determination of which type of correction has been found to provide a better SWR value, said at least two state combinations comprising said trial array.

In a second embodiment of the method, the method comprises: adjusting an impedance value of a reactive matching circuit coupled to said antenna, said act of adjusting being made based at least on: (1) an operating band signal indicative of the current operating band of a transmitter associated with the radio device; (2) a power level signal indicative of the current transmitting power of the transmitter; and/or (3) one or more impedance signals indicative of an impedance mismatch associated with a transmitted signal.

In one variant, said act of adjusting further comprises: defining a set of reactive matching circuit switching element combinations; setting said reactive matching circuit to each of said set of switching element combinations; determining a standing wave ratio (SWR) value for each of said combinations; choosing a lowest one of said SWR values; and adjusting the matching circuit based at least in part on said lowest one of said SWR value.

In another variant, the act of defining further comprises: selecting a first set of state combinations based on a defined operating band and a defined transmitting power of the radio device; setting the reactive matching circuit to each of the set of switching element combinations associated with the first set of state combinations; obtaining an SWR value for each of the switch combinations of the first set; defining a first state combination based at least in part on the obtained SWR value and current switching element states to correct a matching error if it is inductive; and defining a second state combination based at least in part on the obtained SWR value and current switching element states to correct a matching error if it is capacitive. The defined set of reactive matching circuit combinations comprises e.g., said first state combination and said second state combination.

In another aspect of the invention, an apparatus for matching an antenna of a radio device is disclosed. In one embodiment, a transmitter of the radio device comprises a power amplifier controllable by its output power and a transmission path from the power amplifier to the antenna, and the apparatus comprise: a directional coupler in said transmission path to measure a level of a signal transmitted to the antenna and of a signal reflected from the antenna; apparatus configured to determine a standing wave ratio (SWR) value of a signal in the transmission path of the antenna based at least in part on the measured signals provided with the directional coupler; a pi-shaped adjustable reactive matching circuit with a control unit, and further comprising a longitudinal portion of the matching circuit that has a constant capacitance or inductance, and a plurality of transverse portions comprising at least one multiple-way switch, a common terminal of which is coupled to a separate conductor of said transmission path and wherein each change-over terminal is coupled to a ground conductor of the transmission path through a reactive element, the control unit having a first input adapted for operative coupling to a setting unit of an operating band of the radio device, and the control unit being operatively coupled to said directional coupler from its input side, and to said at least one switch in the matching circuit from its output side so as to permit setting of the switches. The control unit comprises in one variant: apparatus configured to define a trial array of the state combinations of the switches in the matching circuit based at least in part on a certain value of the transmitting power, an information associated with the operating band and the SWR value; apparatus configured to set the switches of the matching circuit in turn to the states according to each state combination of the trial array to determine the SWR values correspond to these combinations; apparatus configured to compare the determined SWR values and for finding the lowest one of them; and apparatus configured to start an adjusting process of the antenna matching at regular intervals.

In another variant, each transverse portion of the matching circuit comprises two multiple-way switches, and each multiple-way switch comprises four change-over terminals.

In yet another variant, the control unit is based on a processor and comprises a central processing unit, a memory, input interfaces, output interfaces and a program in accordance with the adjusting process stored in the memory.

In yet another variant, said multiple-way switches are implemented by a pseudomorphic high electron mobility transistor (PHEMT) or a micro electro mechanical system (MEMS) technique.

In another embodiment, the apparatus comprises: a power amplifier comprising a power measuring signal output interface; a directional coupler comprising an impedance measuring signal output interface; a control unit coupled to said power measuring signal output interface and said impedance measuring signal interface; and a reactive matching circuit controlled at least in part by said control unit. The power amplifier, directional coupler and reactive matching circuit are positioned along a transmission path of said radio device.

In one variant, the reactive matching circuit comprises a plurality of multi-state switchable elements. Each of the multi-state switchable elements is coupled to said transmission path of said radio device.

In another variant, the transmission path within said reactive matching circuit comprises a plurality of transverse portions, each transverse portion of the matching circuit comprising two multi-state switchable elements with each multi-state element comprising four change-over terminals.

In still another variant, the control unit comprises: a central processing unit; a computer readable apparatus comprising a memory coupled to said central processing unit; an input interface; and an output interface. The computer readable apparatus has at least one computer program stored thereon, the at least one computer program comprising a plurality of computer executable instructions that when executed by the central processing unit: read a plurality of input signals received via said input interface; execute an algorithm based at least in part on said plurality of signals; and output a plurality of output signals via said output interface.

In another variant, said plurality of output signals adjust the impedance characteristics associated with said reactive matching circuit.

In yet another variant, said multi-state switchable elements are selected from the group consisting of: a pseudomorphic high electron mobility transistor (PHEMT), and a micro electro mechanical system (MEMS) technique.

Figure 4:
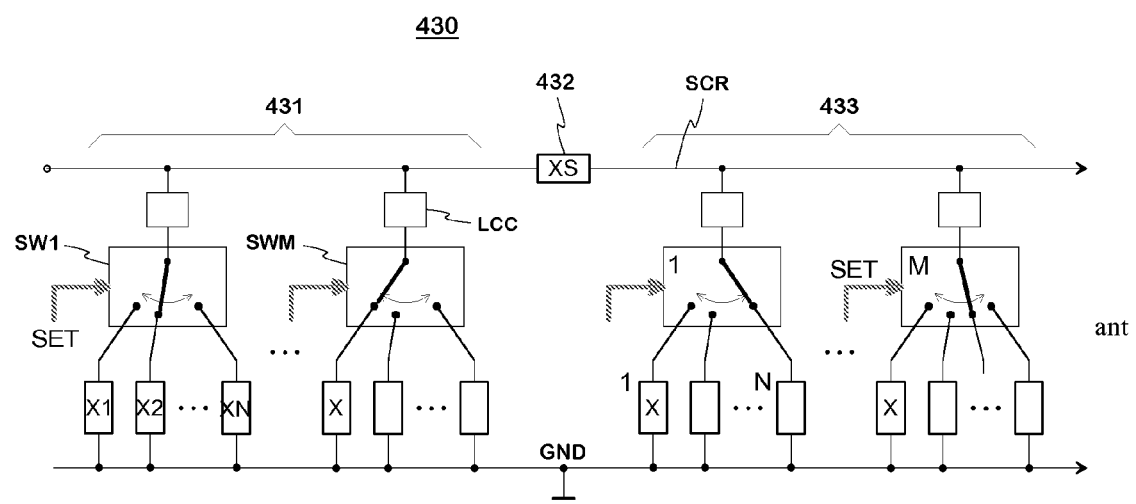
Figure 5:
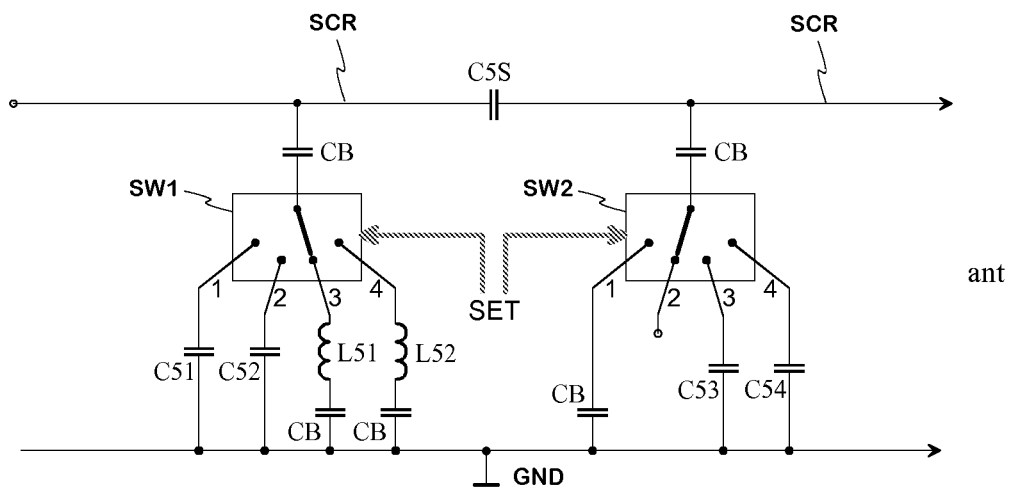
Figure 6:
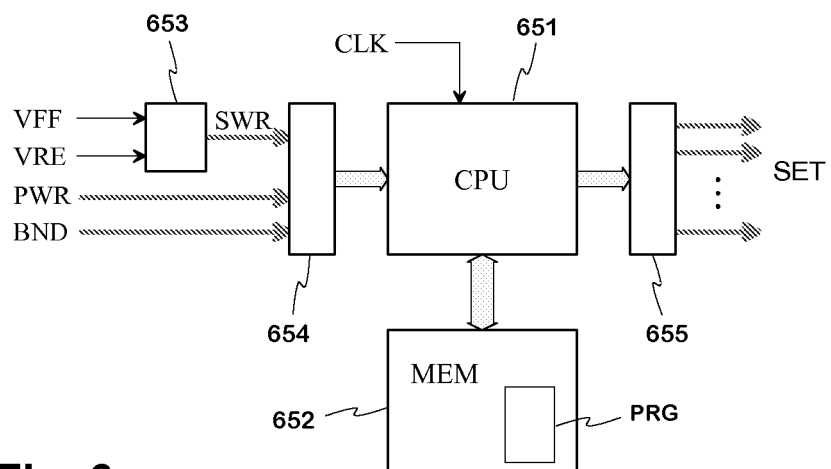
Figure 7:
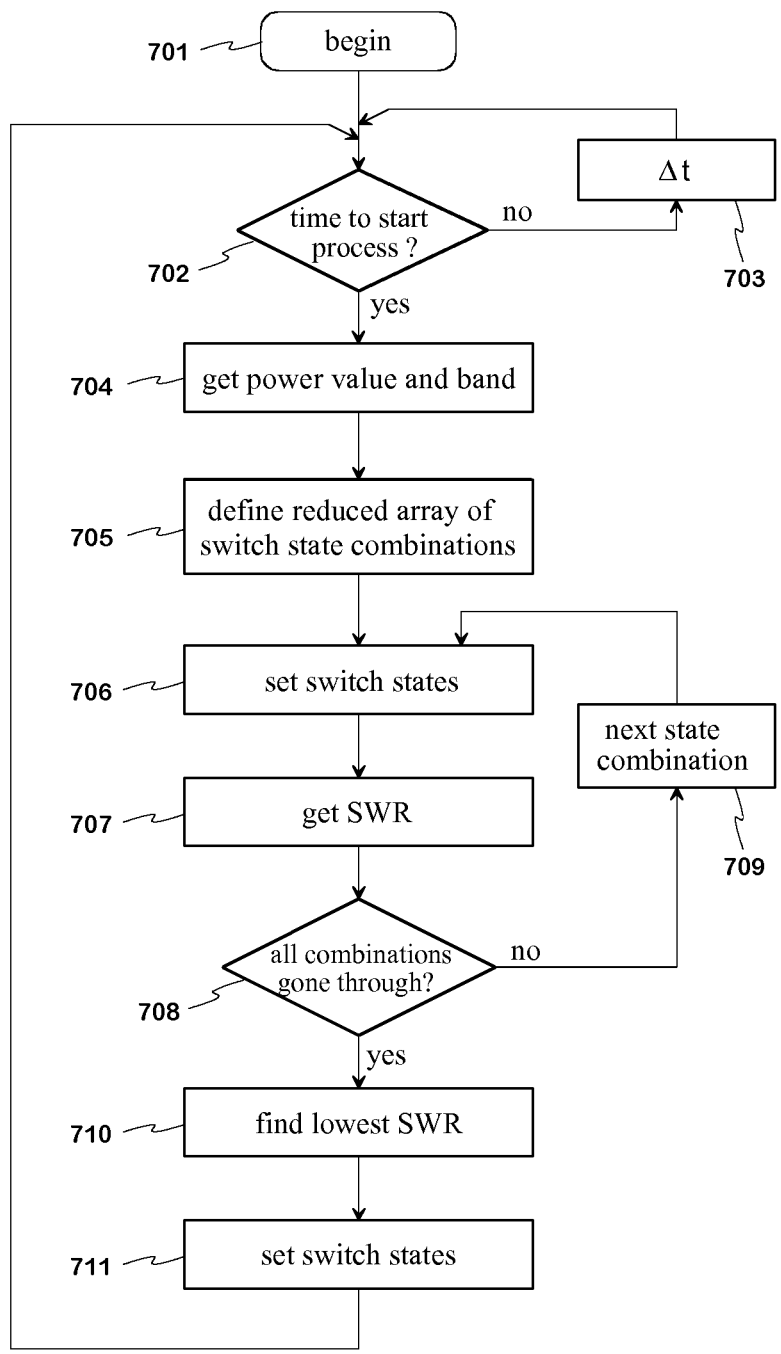
Figure 8:
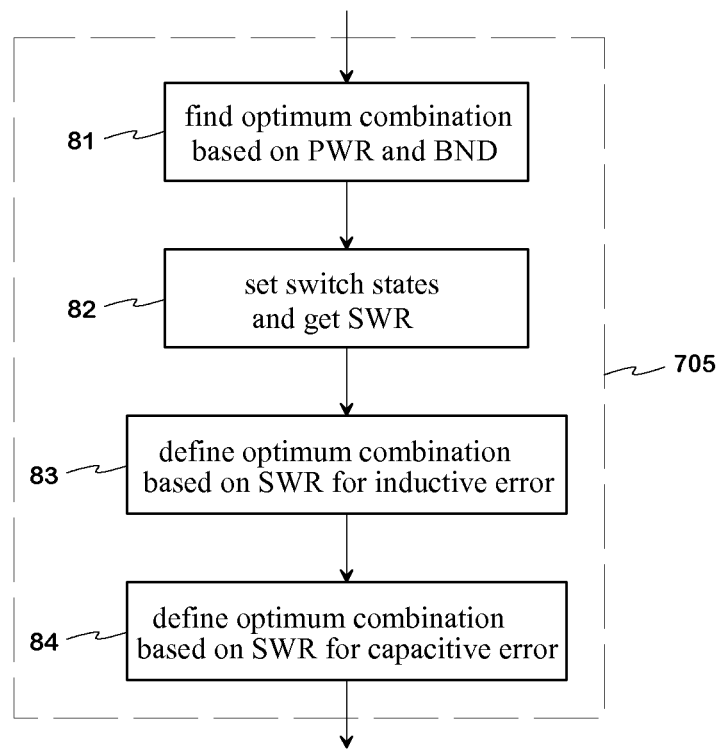
Figure 9:
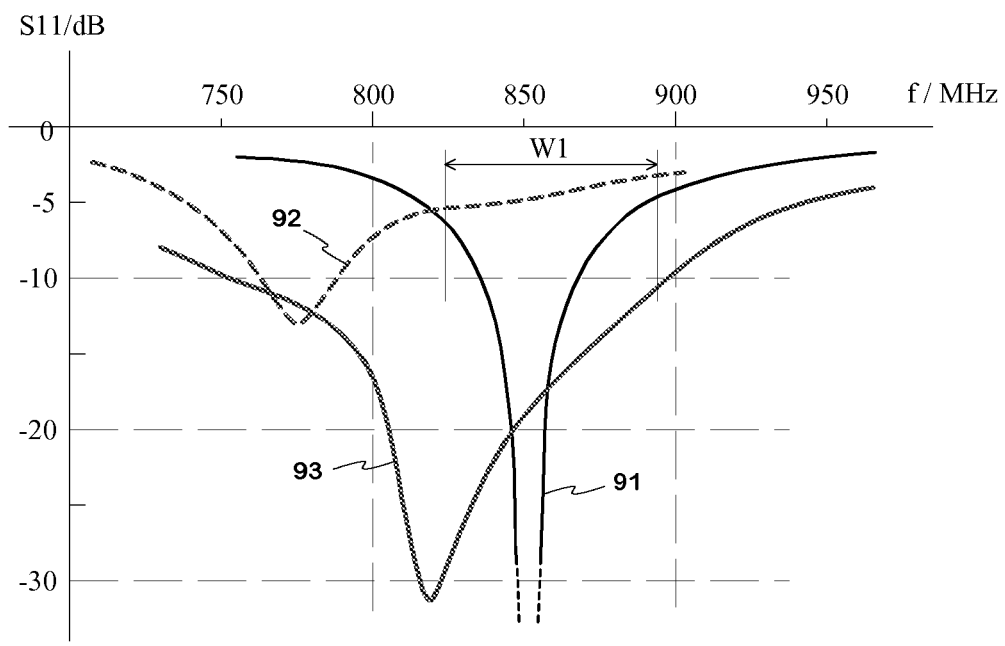
Figure 10:
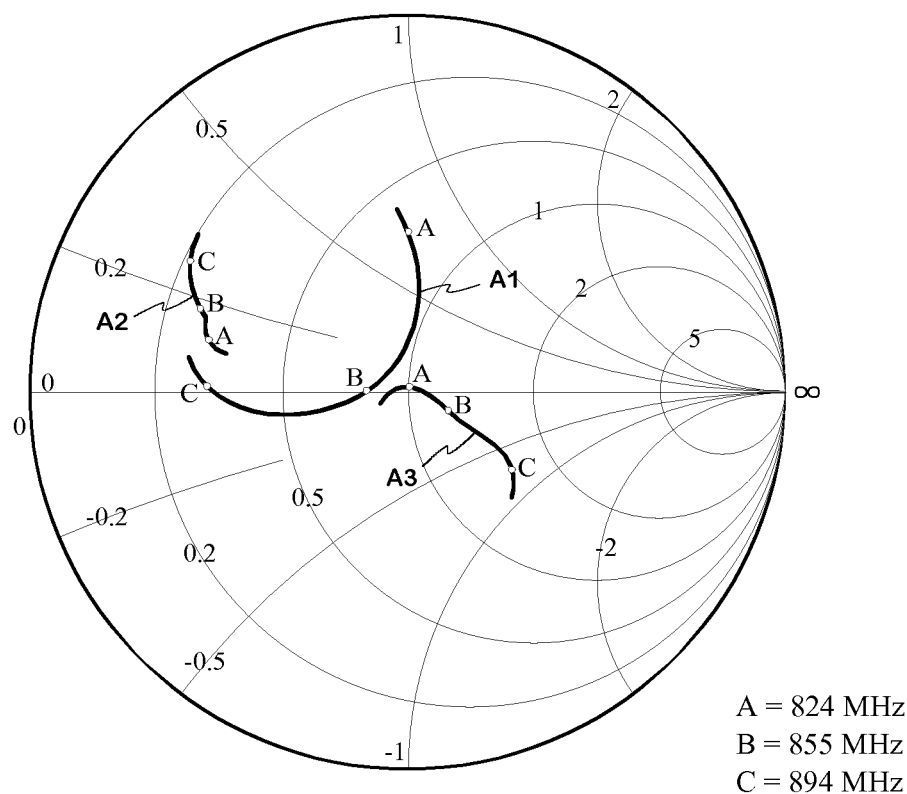

Below, the invention is described in detail. Reference will be made to the accompanying drawings where FIG. 1 presents as block diagram an example of the adaptable matching according to the prior art, FIG. 2 presents an example of the structure of the matching circuit in FIG. 1, FIG. 3 presents as block diagram an example of the arrangement according to the invention, FIG. 4 presents the principle of the structure of the matching circuit belonging to the arrangement according to the invention, FIG. 5 presents an example of the implementation of the matching circuit according to FIG. 4, FIG. 6 presents as block diagram the principled structure of the control unit according to the invention, FIG. 7 presents as flow chart an example of the method according to the invention, FIG. 8 presents an example of the reducing the number of the state combinations to be tried of the switches of the matching circuit, the reducing belonging to the method according to the invention, FIG. 9 presents by means of the reflection coefficient an example of the matching of an antenna provided with an arrangement according to the invention, and FIG. 10 presents by means of the Smith diagram an example of the matching of an antenna provided with an arrangement according to the invention.

FIGS. 1 and 2 were already explained in conjunction with the description of the prior art.

Figure 3:
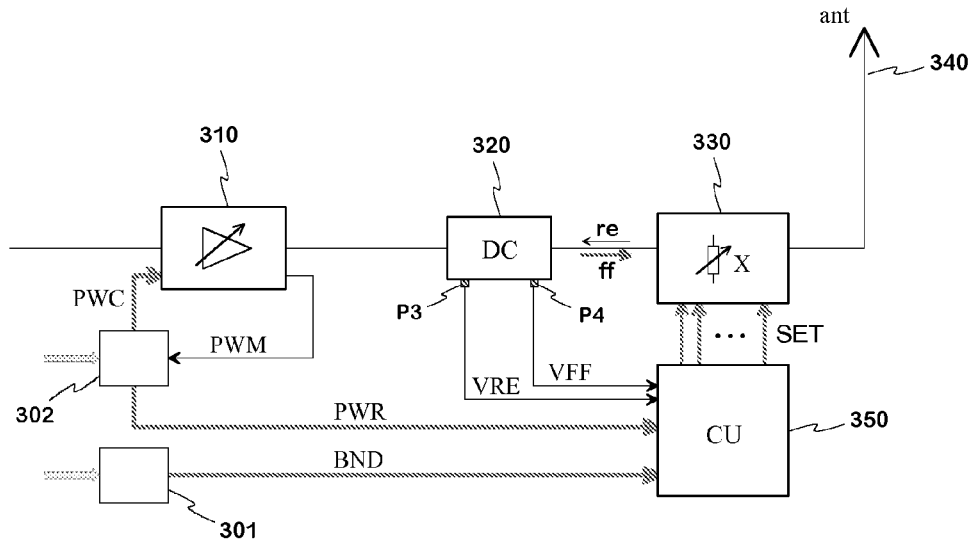

FIG. 3 shows as block diagram an example of the arrangement according to the invention in the transmitter of a radio device. In the transmission path of the transmitter there are, named in the direction of the signal propagation, the power amplifier 310 of the transmitter, a directional coupler 320, a reactive matching circuit 330 and an antenna 340. In addition to the directional coupler and the matching circuit, a control unit 350 of the latter with its couplings belongs to the matching arrangement.

The transmitting power of the amplifier 310 can be changed by the power controlling signal PWC, which represents the set value of the power and is provided from the setting unit 302 of the transmitting power. A measuring signal PWM proportional to the true transmitting power is generated in the amplifier, which signal is used as a feedback signal to bring the transmitting power equal to its set value. The directional coupler 320 outputs two measuring signals: A radio frequency voltage VRE proportional to the reflected field re is received from its port P3 and a radio frequency voltage VFF proportional to the propagating field ff from its port P4. The relative strength of the reflected field increases, when the antenna matching degrades for any reason.

The control unit 350 of the matching circuit has in this example four inputs. One input is connected to the setting unit 301 of the operating band of the radio device, from which unit it is received the band signal BND indicating the current operating band. The change of the band e.g. from the range of 900 MHz to the range of 1.8 GHz causes understandably an impedance change in the antenna, for which reason the matching has to be improved. The second input is connected to said setting unit 302 of the transmitting power, from which it is received the power signal PWR proportional to the set value of the transmitting power. It is specific to the power amplifier that its internal output impedance depends on the transmitting power: The higher the transmitting power, the lower in general the output impedance. A change in the power may cause a remarkable degradation in the matching, if the impedance change is not compensated for. Alternatively, the control unit can be programmed so that it uses as default value a certain value of the transmitting power, e.g. a value close to the maximum power, in which case the power signal PWR is not used and no second input is. The third and fourth input of the control unit are connected to the directional coupler for bringing said voltages VRE and VFF proportional to the reflected and propagating fields. The outputs SET of the control unit again are connected to the matching circuit 330 for selecting its component values.

The component values of the matching circuit are selected by means of the multiple-way switches, the number of which being at least two. The switches have a certain total number of state combinations. The control unit 350 executes at regular intervals an adjusting process. The standing wave ratio, or SWR, of the antenna is obtained from the measuring signals VRE and VFF provided by the directional coupler. SWR can be obtained by hardware with a converter, in which case the SWR value exists in the output of the converter all the time, or by software from the detected forms of the measuring signals. The higher SWR, the poorer matching. On grounds of the SWR value, the information of the operating band coming from the signal BND and the default value of the transmitting power or the set value of the transmitting power coming from the signal PWR the control unit chooses a substantially smaller array from the total array of the state combinations of the switches. The choice takes place in accordance with a certain algorithm, which again is based on the research information of the facts, how the antenna impedance has to be improved in different situations, the information being gathered in the design stage of the device. In the matching process the switches of the matching circuit are in turn set to each of the state combinations, which belong to said smaller array, and the SWR value of the transmitting signal is read in each setting. Finally in the process the control unit sets the switches to the states, the combination of which corresponds to the lowest of the obtained SWR values.

FIG. 4 shows the principled structure of the matching circuit according to the invention. The matching circuit 430 is a π-shaped network, which then comprises in order a first transverse portion 431, a longitudinal portion 432 and a second transverse portion 433. The longitudinal portion is simple. It is constituted by a reactive element XS in series with the separate conductor SCR of the antenna transmission path, which element has a certain constant capacitance or inductance. Generally, in FIG. 4 the symbol 'X' refers to an element/component, which has a certain capacitance or inductance. Naturally, the reactance of such a component then depends on the frequency. Each transverse portion comprises at least one change-over switch SW1, SWM with multiple states, the common terminal of which is coupled to the separate conductor SCR and each change-over terminal is coupled to the ground conductor of the transmission path, or the signal ground GND, through a reactive element X1, X2, XN. In FIG. 4 the number of the switches in the first transverse portion 431 is marked by the symbol M, and the number of the reactive elements to be selected by its first switch SW1 is marked by the symbol N. The transverse portions then can consist of plurality of parallel transverse branches. The number of the switches in the first and second transverse portion can be unequal, and the number of the reactive elements to be selected by one switch is independent of the corresponding number of the other switches. The control SET of the matching circuit comes from the control unit belonging to the matching arrangement, by which control each switch can be separately set to a desired state.

Let us suppose the special case, in which both transverse portions comprise M switches, and the number of the reactive elements to be selected by each switch is N. Thus the total array of the state combinations of the matching circuits's switches includes $(M \cdot N)^2$ alternatives, or different combinations. If e.g. M is two and N is four, the total number of the state combinations becomes 64.

Between each switch and the separate conductor SCR of the transmission path there is in the example of FIG. 4 a LC circuit LCC, the object of which is to attenuate the harmonic frequency components being generated in the switch and to function as an ESD (ElectroStatic Discharge) protector for the switch. In addition, the serial capacitor belonging to the LC circuit functions, when needed, as a blocking capacitor preventing the forming of a direct current circuit from the switch control through the conductor SCR.

FIG. 5 shows a simple example of the matching circuit according to FIG. 4. Each transverse portion of the matching circuit 530 comprise one switch, and the number of the reactive elements to be selected by each switch is four. In this case the total number of the state combinations of the matching circuit becomes 16. The first reactive element of the first switch SW1 is the capacitor C51, in other words the first change-over terminal of the switch SW1 is connected to the signal ground through this capacitor. Correspondingly, the second reactive element of the first switch is the capacitor C52, the third reactive element is the coil L51 and the fourth reactive element the coil L52. In series with both the coil L51 and coil L52 there is a blocking capacitor CB for breaking the direct current path from the switch control. The capacitance of the blocking capacitors is so high, for example 100 pF, that they constitute almost a short-circuit at the operating frequencies of the antenna. The first reactive element of the second switch SW2 is intended to represent a very low reactance at the operating frequencies of the antenna. For this reason there is only a blocking capacitor between the first change-over terminal of the second switch and the signal ground. The second reactive element of the second switch is intended to represent a very high reactance at the operating frequencies of the antenna. For this reason the second change-over terminal of the second switch is open. The third reactive element of the second switch is the capacitor C53 and the fourth reactive element is the capacitor C54. The longitudinal portion of the matching circuit is constituted by the capacitor C5S.

In the example of FIG. 5 one blocking capacitor CB is located also between the common terminal of the first switch SW1 and the separate conductor SCR.

If the matching circuit of FIG. 5 is used with a customary dual-band PIFA, its design is for example the following: C51=1.5 pF, C52=7 pF, L51=3.3 nH, L52=22 nH, C53=1.5 pF, C54=2.7 pF and C5S=4.7 pF. (Here the symbol Cij means both a certain component and its capacitance, correspondingly Lij.) By means of this kind of design the antenna impedance can be improved irrespective of the direction of the error in the Smith diagram, at least approximately.

FIG. 6 shows the principled structure of the control unit according to the invention as a block diagram. The control unit 650 is based on a processor, in which case it comprises a central processing unit 651, a memory 652, input interfaces 654 and output interfaces 655. The control unit further comprises a converter 653, which generates from the radio frequency measuring signals VFF and VRE the standing wave ratio SWR of the transmitting signal in the antenna transmission path, as a binary digit. The SWR signal and the set value signal PWR of the transmitting power and operating band signal BND, which also are binary, are led to the input interfaces 654, from which the central processing unit 651 reads them. The central processing unit transfers the control data corresponding to the state combination of the switches in the matching circuit, which has been selected as a result of the adjusting process, to the output interfaces 655, which send the data further to the matching circuit.

The memory 652 of the control unit contains i.a. a matching program PRG, which implements the adjusting process of the matching. The process is started again at regular intervals, and the interval of the startings is counted either by software or by a timer circuit including in the central processing unit 651. Of course, the central processing unit and the whole control unit need in any case a clock signal CLK.

The control unit 650 with its software can be a separate unit of its own or it can be a part of another processor in the radio device.

FIG. 7 shows as a flow chart an example of the method according to the invention. Step 701 represents the starting situation, in which the transmitter is set to the transmitting state. In steps 702 and 703 it is waited, until the deadline for starting the adjusting process of the antenna matching expires. In step 704 it is read the information of the current set value of the transmitting power and operating band. The control unit provides this information by reading the input interfaces 654 seen in FIG. 6. In step 705 it is defined, on grounds of the operating band, the set value of the transmitting power and the SWR value, a substantially smaller array, or the trial array, from the total array of the state combinations of the switches in the matching circuit. The number of the state combinations to be tried during the process is then reduced. The reduction takes place in accordance with a certain algorithm, from which an example below. In step 706 it is set the states of the switches of the matching circuit so that the state combination belongs to said trial array. Then (step 707) it is read the SWR value of the signal to be transmitted, corresponding to this state combination, and the SWR value is saved in the memory. In step 708 it is checked whether all the state combinations, which belong to the trial array, have already gone through. If not, a new state combination is selected (step 709) and step 706 is resumed. When all the state combinations belonging to the trial array have gone through, the lowest one of the SWR values, which correspond to the tried state combinations, is found (step 710). Finally in the adjusting process, step 711, the switches in the matching circuit are set to the states, which correspond to the found lowest SWR value. Step 702 is resumed after this to wait the starting moment of the next execution round of the process. The interval of the starting moments is e.g. 10 ms. The duration of the process is remarkably shorter depending naturally on the number of the state combinations and the performance of the processor in the control unit.

Alternatively, in step 704 it is read the information only of the current operating band, and in step 705 it is defined the trial array on grounds of the operating band, the default value of the transmitting power and the SWR value.

FIG. 8 shows an example of the method step 705 according to FIG. 7. In the example the matching program PRG first reads the information of the operating band from the signals BND and possibly the set value of the transmitting power from the signal PWR and then finds the state combination for the switches in the matching circuit on grounds of these informations (step 81). The state combination is optimal with the presumption that the external factors do not interfere the antenna matching. The optimal state combinations for different operating bands and possibly transmitting powers are stored in the memory of the control unit on grounds of the measurements made with the radio device in question, and in step 81 at least said information of band is used for addressing the memory. In addition, the information of the power is used, when the current set value of the transmitting power is taken into account. If the total transmitting power range is divided for example to four partial ranges in the control unit and the number of the operating bands is two, there are eight different state combinations in the memory for the execution of step 81. In step 82 the states of the switches in the matching circuit are set in accordance with said supposed optimum, and the SWR value of the signal to be transmitted is read. If it is significantly more than one, the antenna matching must be interfered for external reasons. It does not appear from the SWR value, whether the matching error is to the inductive or capacitive direction. For this reason in the next step 83 it is defined, on grounds of the SWR value and current switch states, a state combination which corrects the matching error wholly according to estimate, if it is inductive. Correspondingly, in step 84 it is defined another state combination which corrects the matching error wholly according to estimate, if the error is capacitive. Naturally the order of the steps 83 and 84 does no matter. After this the operation continues to step 706 in FIG. 7. In this case said trial array is then constituted of only two combinations, from which the one will be selected, which provides a better SWR value. In this way the number of the rounds of the switch setting and SWR determining is reduced, and the matching process becomes as fast as possible.

The adjustment can also made more accurate so that some state combinations are selected in the 'surroundings' of the state combination providing the better SWR value, which constitute the final trial array. The 'surroundings' refer here to the fact that the loading impedances of the amplifier, which correspond to these state combinations, are close to each other in the Smith diagram.

The choices of the state combinations of the switches on grounds of the SWR value and current switch states are based on the calculation. The current switch states are taken into account by using also the impedances of the matching circuit, which correspond to the switch states, as factors in the calculation.

In FIG. 9 there is an example of the matching of an antenna provided with an arrangement according to the invention, shown by means of the reflection coefficient. The antenna is a usual dual-band PIFA, and the matching circuit belonging to the arrangement is like the one in FIG. 5 with the component values mentioned in its description. The example relates to the matching in the lower operating band, which is in this example intended to cover the frequency range 824-894 MHz of the GSM850 system. This range has been marked W1 in FIG. 9. The transmitting power is relatively low. Curve 91 shows the fluctuation of the reflection coefficient S11 as a function of frequency when the antenna is almost in a free space. In this case, the best matching in the lower operating band is obtained when the first switch SW1 is in state 3, or its common terminal is connected to the third change-over terminal, and also the second switch SW2 is in state 3. It is seen from the curve that the reflection coefficient is −5 dB or better in the frequency range W1. Curve 92 shows the fluctuation of the reflection coefficient when a finger of the user is at the antenna on the radiator, and the switches are in the above-mentioned states. It is seen from the curve that the lower resonance frequency of the antenna has been displaced clearly below the range W1 and the reflection coefficient is only between the values −3 dB and −5 dB in the range W1. Curve 93 shows the fluctuation of the reflection coefficient when a finger of the user still is in the same place on the radiator, and the switches are set in a new way. Now the best matching is obtained when the first switch SW1 is in state 4 and the second switch SW2 is in state 2. It is seen from the curve that the matching has been improved so that the reflection coefficient is −11 dB or better in the frequency range W1.

Regarding the upper operating band, improvements in the antenna matching can be done similarly, when it degrades.

In FIG. 10 there is an example of the matching of an antenna provided with an arrangement according to the invention, shown by means of the Smith diagram. In the example the antenna and the matching circuit are the same as in the example of FIG. 9. Also the impedance curves in the diagram correspond to the curves of the reflection coefficient in FIG. 9. Thus curve A1 shows the fluctuation of the impedance in the lower operating band as a function of frequency when the antenna is almost in a free space, curve A2 shows the fluctuation of the impedance when a finger of the user is at the antenna on the radiator and the switch states have not been changed, and curve A3 shows the fluctuation of the impedance when a finger of the user still is in the same place on the radiator, and the switches are set in a new way.

The nominal impedance of the transmission path is 50Ω. In the case of curve A1 the overall impedance is relatively close to it in the middle band, the reactive part being small. At the lower border of the band the impedance is clearly inductive (Z≈34Ω+j37Ω). At the upper border again the reactive part is very small, but the resistive part has fallen to the value of about 15Ω. In the case of curve A2 the mismatch is clearly visible, the impedance Z changing about the value 13Ω+j10Ω). In the matching case shown by curve A3 the impedance is almost precisely 50Ω at the lower border of the band. When moving to the upper border the impedance changes to the value of about 80Ω−j35Ω.

The method and arrangement according to the invention for matching the antenna of a radio device in transmitting condition has been described above. In the flow charts presenting the method, the functional blocks can be drawn also in other ways and in different order than in FIGS. 7 and 8 without changing the idea, though. The trial array of the state combinations of the switches can be defined, instead of the use of a table in the memory, also fully by calculation. In this case the information gathered in the preceding measurements is included in the parameters of the calculation formulas. The extent of the matching circuit belonging to the arrangement can vary a great deal, and the implementation of its reactive elements can vary. At least part of them can be also short planar transmission lines on the surface of a circuit board. The switching parts proper of the switches of the matching circuit are for example of PHEMT (Pseudomorphic High Electron Mobility Transistor) or MEMS (Micro Electro Mechanical System) type. The invention does not limit the structure and type of the antenna proper. The inventive idea can be applied in different ways within the scope defined by the independent claims 1 and 6.

The invention claimed is:

1. An apparatus for matching an antenna of a radio device, said apparatus comprising:
    a power amplifier comprising a power measuring signal output interface;
    a directional coupler comprising an impedance measuring signal output interface;
    a control unit coupled to said power measuring signal output interface and said impedance measuring signal interface; and
    a reactive matching circuit controlled at least in part by said control unit;
    wherein said power amplifier, directional coupler and reactive matching circuit are positioned along a transmission path of said radio device.

2. The apparatus of claim 1, wherein the control unit is further configured to adjust an impedance value of the reactive matching circuit based at least on: (1) an operating band signal indicative of the current operating band of a transmitter associated with the radio device; (2) a power level signal indicative of the current transmitting power of the transmitter; and/or (3) one or more impedance signals indicative of an impedance mismatch associated with a transmitted signal.

3. The apparatus of claim 2, wherein the control unit further comprises a computer readable apparatus having at least one computer program stored thereon, the at least one computer program comprising a plurality of computer executable instructions that when executed by a central processing unit:
    define a set of reactive matching circuit switching element combinations;
    set said reactive matching circuit to each of said set of switching element combinations;
    determine a standing wave ratio (SWR) value for each of said combinations;

choose a lowest one of said SWR values; and
adjust said reactive matching circuit based at least in part on said lowest one of said SWR value;
wherein the acts of defining, setting, determining, choosing and adjusting aids in the adjustment of the impedance value of the reactive matching circuit.

4. The apparatus of claim 3, wherein the control unit further comprises a computer readable apparatus having at least one computer program stored thereon that define the set of reactive matching circuit switching element combinations, the at least one computer program comprising a plurality of computer executable instructions that when executed by a central processing unit:
select a first set of state combinations based on a defined operating band and a defined transmitting power of the radio device;
set the reactive matching circuit to each of the set of switching element combinations associated with the first set of state combinations;
obtain an SWR value for each of the switch combinations of the first set;
define a first state combination based at least in part on the obtained SWR value and current switching element states to correct a matching error if it is inductive; and
define a second state combination based at least in part on the obtained SWR value and current switching element states to correct a matching error if it is capacitive.

5. The apparatus of claim 4, wherein said defined set of reactive matching circuit combinations comprises said first state combination and said second state combination.

6. The apparatus of claim 1, wherein the reactive matching circuit comprises a plurality of multi-state switchable elements.

7. The apparatus of claim 6, wherein each of the multi-state switchable elements is coupled to said transmission path of said radio device.

8. The apparatus of claim 7, wherein the transmission path within said reactive matching circuit comprises a plurality of transverse portions, each transverse portion of the matching circuit comprising two multi-state switchable elements with each multi-state element comprising four change-over terminals.

9. The apparatus of claim 7, wherein said control unit comprises:
a central processing unit;
a computer readable apparatus comprising a memory coupled to said central processing unit;
an input interface; and
an output interface;
wherein said computer readable apparatus has at least one computer program stored thereon, the at least one computer program comprising a plurality of computer executable instructions that when executed by the central processing unit:
read a plurality of input signals received via said input interface;
execute an algorithm based at least in part on said plurality of signals; and
output a plurality of output signals via said output interface.

10. The apparatus of claim 9, wherein said plurality of output signals adjust the impedance characteristics associated with said reactive matching circuit.

11. The apparatus of claim 10, wherein said multi-state switchable elements are selected from the group consisting of a pseudomorphic high electron mobility transistor (PHEMT), and a micro electro mechanical system (MEMS) technique.

12. The apparatus of claim 7, wherein said control unit comprises:
a central processing unit;
a computer readable apparatus comprising a memory coupled to said central processing unit, wherein said computer readable apparatus has at least one computer program stored thereon, the at least one computer program comprising a plurality of computer executable instructions that are configured to, when executed by the central processing unit:
read an information associated with an operating band that is in use;
define a trial array comprised of a subset of state combinations, said trial array being substantially smaller than a total array of a plurality of state combinations of said multi-way switchable elements;
utilize at least a certain value of the transmitting power, said information associated with the operating band that is in use, and a standing wave ratio (SWR) value when defining the trial array;
set the multi-way switchable elements of the reactive matching circuit to each of the states associated with the subset of state combinations of the trial array;
determine the SWR value of the signal to be transmitted in each state and determine the lowest one of the SWR values determined; and
set the multi-state switchable elements of the reactive matching circuit to the state corresponding to the lowest one of the SWR values determined.

13. The apparatus of claim 12, wherein said certain value of the transmitting power comprises a current set value of the transmitting power.

14. The apparatus of claim 12, wherein said at least one computer program for defining the trial array further comprises a plurality of computer executable instructions that when executed by the central processing unit:
address a memory by means of at least the information associated with the operating band that is in use, the memory including a plurality of optimal state combinations for different operating bands and at least one transmitting power based on measurements made with the radio device;
set the states of the multi-state switchable elements in the matching circuit in accordance with the state combination retrieved from said memory;
read the SWR value of the signal to be transmitted;
define based at least in part on the read SWR value and current switching element states a first state combination which is arranged to correct a matching error if it is inductive, and a second state combination, which is arranged to correct the matching error if it is capacitive; and
determine the SWR values of the signal to be transmitted corresponding to the first and second state combinations.

15. The apparatus of claim 14, wherein said trial array comprises the first state combination correcting an inductive matching error, and the second state combination correcting a capacitive matching error.

16. The apparatus of claim 14, wherein the adjustment of the matching circuit is made more accurate by defining at least two state combinations which are arranged to correct inductive or capacitive matching error based on the determination of which type of correction has been found to provide a better SWR value, said at least two state combinations comprising said trial array.

17. An apparatus for matching an antenna of a radio device, wherein a transmitter of the radio device comprises a power amplifier controllable by its output power and a transmission path from the power amplifier to the antenna, the apparatus comprising:
- a directional coupler in said transmission path to measure a level of a signal transmitted to the antenna and of a signal reflected from the antenna;
- apparatus configured to determine a standing wave ratio (SWR) value of a signal in the transmission path of the antenna based at least in part on the measured signals provided with the directional coupler;
- a pi-shaped adjustable reactive matching circuit with a control unit, and further comprising a longitudinal portion of the matching circuit that has a constant capacitance or inductance, and a plurality of transverse portions comprising at least one multiple-way switch, a common terminal of which is coupled to a separate conductor of said transmission path and wherein each change-over terminal is coupled to a ground conductor of the transmission path through a reactive element, the control unit having a first input adapted for operative coupling to a setting unit of an operating band of the radio device, and the control unit being operatively coupled to said directional coupler from its input side, and to said at least one switch in the matching circuit from its output side so as to permit setting of the switches, the control unit comprising:
  - apparatus configured to define a trial array of the state combinations of the switches in the matching circuit based at least in part on a certain value of the transmitting power, an information associated with the operating band and the SWR value;
  - apparatus configured to set the switches of the matching circuit in turn to the states according to each state combination of the trial array to determine the SWR values correspond to these combinations;
  - apparatus configured to compare the determined SWR values and for finding the lowest one of them; and
  - apparatus configured to start an adjusting process of the antenna matching at regular intervals.

18. The apparatus of claim 17, characterized in that each transverse portion of the matching circuit comprises two multiple-way switches, and each multiple-way switch comprises four change-over terminals.

19. The apparatus of claim 17, characterized in that the control unit is based on a processor and comprises a central processing unit, a memory, input interfaces, output interfaces and a program in accordance with the adjusting process stored in the memory.

20. The apparatus of claim 17, characterized in that said multiple-way switches are implemented by a pseudomorphic high electron mobility transistor (PHEMT) or a micro electro mechanical system (MEMS) technique.

* * * * *